(12) United States Patent
Auld et al.

(10) Patent No.: US 8,637,627 B2
(45) Date of Patent: *Jan. 28, 2014

(54) PHENOXYPHENYL POLYSILOXANE COMPOSITION AND METHOD FOR MAKING AND USING SAME

(75) Inventors: Kathleen A. Auld, Feasterville, PA (US); David M. Conner, Bethlehem, PA (US); Garo Khanarian, Princeton, NJ (US); David Wayne Mosley, Philadelphia, PA (US)

(73) Assignee: Rohm and Haas Company, Philadelphia, PA (US)

( * ) Notice: Subject to any disclaimer, the term of this patent is extended or adjusted under 35 U.S.C. 154(b) by 441 days.

This patent is subject to a terminal disclaimer.

(21) Appl. No.: 12/315,682

(22) Filed: Dec. 5, 2008

(65) Prior Publication Data

US 2009/0146324 A1 Jun. 11, 2009

Related U.S. Application Data

(60) Provisional application No. 61/005,639, filed on Dec. 6, 2007.

(51) Int. Cl.
*C08G 77/08* (2006.01)

(52) U.S. Cl.
USPC .................. 528/15; 528/31; 528/32; 525/478

(58) Field of Classification Search
USPC .................. 528/15, 31, 32; 525/478
See application file for complete search history.

(56) References Cited

U.S. PATENT DOCUMENTS

| 2,258,221 | A | * | 10/1941 | Rochow | 174/121 SR |
| 2006/0116499 | A1 | * | 6/2006 | Ootake et al. | 528/9 |
| 2008/0090986 | A1 | * | 4/2008 | Khanarian et al. | 528/15 |
| 2008/0160323 | A1 | * | 7/2008 | Mosley et al. | 428/447 |

* cited by examiner

*Primary Examiner* — Margaret Moore
(74) *Attorney, Agent, or Firm* — Jonathan D. Baskin

(57) ABSTRACT

A curable phenoxyphenyl polysiloxane composition is disclosed. A cured phenoxyphenyl polysiloxane composition is further disclosed, along with a method of making that cured phenoxyphenyl polysiloxane composition from the curable phenoxyphenyl silicon composition. An encapsulated semiconductor device, and a method of making that encapsulated semiconductor device by coating a semiconductor element of a semiconductor device with cured phenoxyphenyl polysiloxane are further disclosed.

10 Claims, No Drawings

PHENOXYPHENYL POLYSILOXANE COMPOSITION AND METHOD FOR MAKING AND USING SAME

This application claims the benefit under 35 U.S.C. §119 (e) of U.S. Provisional Application Ser. No. 61/005,639, filed Dec. 6, 2007, the entire contents of which are incorporated herein by reference.

The present invention relates to a curable phenoxyphenyl silicon composition, to a method of making a cured phenoxyphenyl polysiloxane composition therefrom, and to that cured phenoxyphenyl polysiloxane composition, as well as to an encapsulated semiconductor device, and a method of making that encapsulated semiconductor device by coating a semiconductor element of a semiconductor device with the cured phenoxyphenyl polysiloxane composition.

There is a need for transparent high refractive index silicones for optical applications. There is also a need for thermally stable silicones. In addition, there is need for polysiloxanes and other silicon-based polymers having high refractive index, good thermal stability, and transparency which are liquid, or which form curable compositions which are liquid before curing, during some portion of curing, or both. In many cases, silicones are needed which can be cured into elastomers. In these cases it is convenient to have fluid silicone-based precursors which can be cross-linked to form cured compositions.

High refractive index polymers are of interest for optical device encapsulation, medical optical devices such as contacts or intraocular lenses, and plastic optical components such as lenses and waveguides. In many of these cases, it is desirable to cure the polymer in place using fluid silicon-containing reactants, and to use silicon-containing reactants that are high refractive index polymers, such as polysiloxanes.

Manufacturers of high brightness LEDs desire optical polymers with high transparency in the visible region, high refractive indexes (indexes of 1.6 or more), and excellent heat stability over tens of thousands of hours of operation. Additionally the LED industry uses liquid prepolymers, which are then cured in place after much of the device is assembled. Therefore the curing polymer system must show minimal shrinkage, and must be curable under conditions which do not harm the assembled device. At this time, manufacturers employ epoxies and silicones for this purpose. However, epoxies exhibit too much yellowing for use in the new high power LED devices, which can operate at junction temperatures of 150° C. Silicones are therefore becoming the dominant encapsulant in LEDs, since some silicones exhibit excellent heat stability and little yellowing. Commercial silicone encapsulants currently have refractive indexes ranging from 1.41 to 1.57. The refractive index of the encapsulant plays an important role in determining how much light is extracted from the LED device. This is due to high, sometimes approaching total, internal reflection of light as it passes from the solid-state high refractive index LED to a low index polymer medium. Typical LED devices have refractive indexes of 2.5. Thus, there is great interest in obtaining silicone encapsulants having higher refractive indices.

The refractive index of a polymer is determined by the molar refractivities of its constituent groups and molar volume. Commercial silicone monomers are predominantly combinations of aliphatic groups and phenyl groups. This effectively limits the refractive index in traditional liquid silicones to an upper end of about 1.57-1.58. The refractive index of poly(diphenylsiloxane) is 1.61, but it is a solid polymer. In Gadda, T. M. and Weber, W. P. "Synthesis and Characterization of alt-Copoly(carbosiloxane)s Containing Oligodiphenylsiloxane Segments," J. Poly. Sci. A, Vol. 43 (2005), 2155-2163, the authors point out the following: "Despite these attractive properties, poly(diphenylsiloxane) (PDPS) has little utility because it is a rather intractable material."

Since many applications require fluid prepolymers, it is necessary to blend lower glass transition temperature ($T_g$) monomers with diphenylsiloxane monomers in order to obtain a liquid, leading to a reduction in the refractive index. This leads to an upper end RI of 1.57-1.58, as mentioned. What is needed is a monomer having a refractive index that is similar to, or higher than, diphenyl siloxane monomers, while also having a lower glass transition temperature ($T_g$) than diphenylsiloxane monomers.

U.S. Pat. No. 3,114,759 discloses polysiloxane compositions having a terminal p-phenoxyphenylphenylmethylsilane group, wherein the capping is introduced in order to increase heat stability. U.S. Pat. No. 3,385,878 discloses cyclosiloxanes having 3 and 4 monomer units. These cyclosiloxanes contain one or two di(p-phenoxyphenyl)silyl units combined with diphenylsilyl units.

We have surprisingly discovered that curable phenoxyphenyl silicon compositions having high refractive index and excellent fluidity may be achieved. Those compositions include alkenyl phenoxyphenyl polysiloxanes having a range of phenoxyphenyl group content and branching, and may be cured to form cured phenoxyphenyl polysiloxane compositions useful as encapsulants for light emitting devices. Silicon-based precursors which include silicon bonded phenoxyphenyl groups have very desirable properties, and are useful as components of the curable phenoxyphenyl silicon compositions. For example, p-phenoxyphenylphenylsilyl compounds can be polymerized to make a fluid polymer composition. Fluid poly(p-phenoxyphenyl)phenylsiloxanes can be produced with a refractive index of 1.59 to 1.64. This is an improvement over the traditional high RI diphenylsilyl monomers, which produce a solid homopolymer even at low degrees of polymerization (i.e., as low as 5 or 6 polymer units).

One aspect of the present invention is directed to a cured phenoxyphenyl polysiloxane composition comprising an alkylene-bridged phenoxyphenyl polysiloxane represented by the average compositional Formula I,

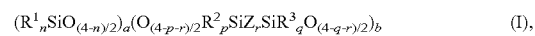

$$(R^1{}_n SiO_{(4-n)/2})_a (O_{(4-p-r)/2} R^2{}_p SiZ_r SiR^3{}_q O_{(4-q-r)/2})_b \quad (I),$$

wherein:
  each $R^1{}_n SiO_{(4-n)/2}$ is, independently, a primary siloxane unit selected from an M-unit, a D-unit, a T-unit, and a Q-unit;
  for each $(R^1{}_n SiO_{(4-n)/2})$ unit:
  subscript n equals independently 0, 1, 2, or 3;
    each of the two primary siloxane units of $O_{(4-p-r)/2} R^2{}_p SiZ_r SiR^3{}_q O_{(4-q-r)/2}$ is, independently, selected from M-unit, D-unit, T-unit, and Q-unit;
  for each $(O_{(4-p-r)/2} R^2{}_p SiZ_r SiR^3{}_q O_{(4-q-r)/2})$ unit:
    subscript p equals 0, 1, 2, or 3;
    subscript q equals 0, 1, 2 or 3;
    p+q=0 to [8−(2r+1)];
    subscript r=1, 2, or 3;
    Z is —CHR⁴CHR⁵—X$_s$—, wherein:
      —CHR⁴CHR⁵—X$_s$— is a silicon-bridging akylene moiety;
      X is independently selected from: linear, branched or cyclic saturated $C_1$-$C_{16}$ hydrocarbon radical, o-phenyl, m-phenyl, p-phenyl, and combinations thereof;

subscript s=0 or 1; and $R^4$ and $R^5$ are each a hydrogen atom;

$R^1$, $R^2$, and $R^3$ is a silicon-bonded organic group selected from alkenyl, hydrogen atom, aryl, alkyl, hydroxy, alkoxy, aryloxy, phenoxyphenyl, other organic radical, and combinations thereof;

the phenoxyphenyl is selected from o-phenoxyphenyl, m-phenoxyphenyl, p-phenoxyphenyl, and combinations thereof;

at least one of $R^1$, $R^2$, and $R^3$ is a silicon bonded phenoxyphenyl group;

subscripts a and b are selected to conform with the mole fraction of the $(R^1{}_n SiO_{(4-n)/2})$ unit and the $(O_{(4-p-r)/2} R^2{}_p SiZ_r SiR^3{}_q O_{(4-q-r)/2})$ unit, respectively;

$0 \leq a < 1$; $0 < b \leq 1$; and $a+b=1$;

wherein:

the M-unit is present in a molar fraction of at least 0.001 to equal and or less than 1, the D-unit is present in a molar fraction of equal to or greater than 0 and no more than 0.999, the T-unit is present in a molar fraction of equal to or greater than 0 and no more than 0.20, the Q-unit is present in a molar fraction equal to or greater than 0 and no more than 0.10, each based on the total moles of primary siloxane units contained in the alkylene-bridged phenoxyphenyl polysiloxane; and wherein:

when 0≤mole fraction T-unit≤0.03, 0≤mole fraction Q-unit≤0.03, and 0.00≤mole fraction (T-unit+Q-unit) ≤0.03, based on the total moles of primary siloxane units contained in the alkylene-bridged phenoxyphenyl polysiloxane, the silicon bonded phenoxyphenyl group is present in an amount of at least 15 mole percent and no more than 99 mole percent, based on total moles of the silicon bonded organic groups of the alylene-bridged phenoxphenyl polysiloxane;

when 0≤mole fraction T-unit<0.07, 0≤mole fraction Q-unit<0.07, and 0.03<mole fraction (T-unit+Q-unit) <0.07, based on the total moles of primary siloxane units contained in the alkylene-bridged phenoxyphenyl polysiloxane, the silicon bonded phenoxyphenyl group is present in an amount of at least 5 mole percent and no more than 99 mole percent, based on total moles of the silicon bonded organic groups of the multialkenyl phenoxyphenyl polysiloxane; and when 0≤mole fraction T-unit≤0.20, 0≤mole fraction Q-unit≤0.10, and 0.07≤mole fraction (T-unit+Q-unit) ≤0.20, based on the total moles of primary siloxane units contained in the alkylene-bridged phenoxyphenyl polysiloxane, the silicon bonded phenoxyphenyl group is present in an amount of greater than 0 mole percent and no more than 99 mole percent, based on total moles of the silicon bonded organic groups of the multialkenyl phenoxyphenyl polysiloxane.

$$(R^1{}_n SiO_{(4-n)/2})_a (O_{(4-p-r)/2} R^2{}_p SiZ_r SiR^3{}_q O_{(4-q-r)/2})_b \quad (I),$$

wherein:

each $R^1{}_n SiO_{(4-n)/2}$ is, independently, a primary siloxane unit selected from an M-unit, a D-unit, a T-unit, and a Q-unit;

for each $(R^1{}_n SiO_{(4-n)/2})$ unit:

subscript n equals independently 0, 1, 2, or 3;

each of the two primary siloxane units of $O_{(4-p-r)/2} R^2{}_p SiZ_r SiR^3{}_q O_{(4-q-r)/2}$ is, independently, selected from M-unit, D-unit, T-unit, and Q-unit;

for each $(O_{(4-p-r)/2} R^2{}_p SiZ_r SiR^3{}_q O_{(4-q-r)/2})$ unit:

subscript p equals 0, 1, 2, or 3;

subscript q equals 0, 1, 2 or 3;

p+q=0 to [8−(2r+1)];

subscript r=1, 2, or 3;

Z is —$CHR^4 CHR^5$—$X_s$—, wherein:

—$CHR^4 CHR^5$—$X_s$— is a silicon-bridging akylene moiety;

X is independently selected from: linear, branched or cyclic saturated $C_1$-$C_{16}$ hydrocarbon radical, o-phenyl, m-phenyl, p-phenyl, and combinations thereof;

subscript s=0 or 1; and $R^4$ and $R^5$ are each a hydrogen atom;

$R^1$, $R^2$, and $R^3$ is a silicon-bonded organic group selected from alkenyl, hydrogen atom, aryl, alkyl, hydroxy, alkoxy, aryloxy, phenoxyphenyl, other organic radical, and combinations thereof;

the phenoxyphenyl is selected from o-phenoxyphenyl, m-phenoxyphenyl, p-phenoxyphenyl, and combinations thereof;

at least one of $R^1$, $R^2$, and $R^3$ is a silicon bonded phenoxyphenyl group;

subscripts a and b are selected to conform with the mole fraction of the $(R^1{}_n SiO_{(4-n)/2})$ unit and the $(O_{(4-p-r)/2} R^2{}_p SiZ_r SiR^3{}_q O_{(4-q-r)/2})$ unit, respectively;

$0 \leq a < 1$; $0 < b \leq 1$; and $a+b=1$;

wherein:

the M-unit is present in a molar fraction of at least 0.001 to equal and or less than 1, the D-unit is present in a molar fraction of equal to or greater than 0 and no more than 0.999, the T-unit is present in a molar fraction of equal to or greater than 0 and no more than 0.20, the Q-unit is present in a molar fraction equal to or greater than 0 and no more than 0.10, each based on the total moles of primary siloxane units contained in the alkylene-bridged phenoxyphenyl polysiloxane; and wherein:

when 0≤mole fraction T-unit≤0.03, 0≤mole fraction Q-unit≤0.03, and 0.00≤mole fraction (T-unit+Q-unit) ≤0.03, based on the total moles of primary siloxane units contained in the alkylene-bridged phenoxyphenyl polysiloxane, the silicon bonded phenoxyphenyl group is present in an amount of at least 15 mole percent and no more than 99 mole percent, based on total moles of the silicon bonded organic groups of the alylene-bridged phenoxphenyl polysiloxane;

when 0≤mole fraction T-unit<0.07, 0≤mole fraction Q-unit<0.07, and 0.03<mole fraction (T-unit+Q-unit) <0.07, based on the total moles of primary siloxane units contained in the alkylene-bridged phenoxyphenyl polysiloxane, the silicon bonded phenoxyphenyl group is present in an amount of at least 5 mole percent and no more than 99 mole percent, based on total moles of the silicon bonded organic groups of the multialkenyl phenoxyphenyl polysiloxane; and when 0≤mole fraction T-unit≤0.20, 0≤mole fraction Q-unit≤0.10, and 0.07≤mole fraction (T-unit+Q-unit)

≤0.20, based on the total moles of primary siloxane units contained in the alkylene-bridged phenoxyphenyl polysiloxane, the silicon bonded phenoxyphenyl group is present in an amount of greater than 0 mole percent and no more than 99 mole percent, based on total moles of the silicon bonded organic groups of the multialkenyl phenoxyphenyl polysiloxane.

A second aspect of the present invention is directed to a curable phenoxyphenyl polysiloxane composition comprising:

A. a multialkenyl phenoxyphenyl polysiloxane represented by average compositional formula II,

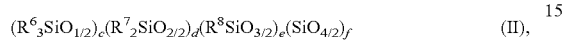
$$(R^6{}_3SiO_{1/2})_c(R^7{}_2SiO_{2/2})_d(R^8SiO_{3/2})_e(SiO_{4/2})_f \quad (II),$$

wherein:
$R^6{}_3SiO_{1/2}$, $R^7{}_2SiO_{2/2}$, $R^8SiO_{3/2}$, and $SiO_{4/2}$ are, respectively, an M-unit, a D-unit, a T-unit, and a Q-unit, all of which are primary siloxane units;

each of $R^6$, each of $R^7$, and each of $R^8$ is, independently, a silicon bonded organic group selected from alkenyl, phenoxyphenyl, aryl other than phenoxyphenyl, alkyl, hydroxy, alkoxy, aryloxy, other organic radical, hydrogen, and combinations thereof;

at least two silicon bonded organic groups are alkenyl;
the alkenyl group is CH2=CH—$X_s$— wherein s=0 or 1, and X is independently selected from: linear, branched or cyclic saturated $C_1$-$C_{16}$ hydrocarbon radical, o-phenyl, m-phenyl, p-phenyl, and combinations thereof;

the alkenyl group is present in an amount of 1 mole percent to no more than 20 mole percent, based on total moles of the silicon bonded organic group of the multialkylene phenoxyphenyl polysiloxane;

at least one silicon bonded organic group is a phenoxyphenyl group selected from o-phenoxyphenyl, m-phenoxyphenyl, p-phenoxyphenyl, and combinations thereof;

the silicon bonded phenoxyphenyl group is present in an amount of greater than 0 mole percent and no more than 99 mole percent, based on the total moles of silicon bonded organic groups in the alkenyl phenoxyphenyl polysiloxane;

subscripts c, d, e, and f are selected to conform with the mole fractions of $R^6{}_3SiO_{1/2}$, $R^7{}_2SiO_{2/2}$, $R^8SiO_{3/2}$, and $SiO_{4/2}$, respectively;

0.001≤c≤1; 0≤d≤0.999; 0≤e≤0.20; 0≤f≤0.10; and c+d+e+f=1; and the multialkylene phenoxyphenyl polysiloxane has:
 i) a number average molecular weight of at least 500 grams/mole and no more than 5,000 grams/mole; and
 ii) a viscosity of at least 10 and no more than 7,000,000 centipoise;

B. a multihydrido silicon compound having at least two silicon bonded hydrogen atoms; and C. a hydrosilation catalyst in an amount effective to catalyze hydrosilation.

A third aspect of the present invention is directed to a method of making the cured phenoxyphenyl polysiloxane composition of claim 1, comprising the steps of:

A. providing a multialkenyl phenoxyphenyl polysiloxane represented by average compositional formula II,

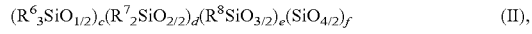
$$(R^6{}_3SiO_{1/2})_c(R^7{}_2SiO_{2/2})_d(R^8SiO_{3/2})_e(SiO_{4/2})_f \quad (II),$$

wherein:
$R^6{}_3SiO_{1/2}$, $R^7{}_2SiO_{2/2}$, $R^8SiO_{3/2}$, and $SiO_{4/2}$ are, respectively, an M-unit, a D-unit, a T-unit, and a Q-unit, all of which are primary siloxane units;

each of $R^6$, each of $R^7$, and each of $R^8$ is, independently, a silicon bonded organic group selected from alkenyl, phenoxyphenyl, aryl other than phenoxyphenyl, alkyl, hydroxy, alkoxy, aryloxy, other organic radical, hydrogen, and combinations thereof;

at least two silicon bonded organic groups are alkenyl;
the alkenyl group is CH2=CH—$X_s$— wherein s=0 or 1, and X is selected from: linear, branched, or cyclic $C_1$-$C_{16}$ alkyl, o-phenyl, m-phenyl, p-phenyl, and combinations thereof;

the alkenyl group is present in an amount of 1 mole percent to no more than 20 mole percent, based on total moles of the silicon bonded organic group of the multialkylene phenoxyphenyl polysiloxane;

at least one silicon bonded organic group is a phenoxyphenyl group selected from o-phenoxyphenyl, m-phenoxyphenyl, p-phenoxyphenyl, and combinations thereof;

the silicon bonded phenoxyphenyl group is present in an amount of greater than 0 mole percent and no more than 99 mole percent, based on the total moles of silicon bonded organic groups in the alkenyl phenoxyphenyl polysiloxane;

subscripts c, d, e, and f are selected to conform with the mole fractions of $R^6{}_3SiO_{1/2}$, $R^7{}_2SiO_{2/2}$, $R^8SiO_{3/2}$, and $SiO_{4/2}$, respectively;

0.001≤c≤1; 0≤d≤0.999; 0≤e≤0.20; 0≤f≤0.10; and c+d+e+f=1; and the multialkylene phenoxyphenyl polysiloxane has:
 i) a number average molecular weight of at least 500 grams/mole and no more than 5,000 grams/mole; and
 ii) a viscosity of at least 10 and no more than 7,000,000 centipoise;

B. providing a multihydrido silicon compound having at least two silicon bonded hydrogen atoms;

C. providing a hydrosilation catalyst in an amount effective to catalyze hydrosilation;

D. optionally, providing a diluent wherein:
 the diluent is selected from reactive diluent and inert diluent;
 the reactive diluent is present in the curable phenoxyphenyl polysiloxane composition in an amount of equal to or greater than 0 weight percent and no more than 30 weight percent, based on the weight of the curable phenoxyphenyl polysiloxane composition;
 the inert diluent is present in the curable phenoxyphenyl polysiloxane composition in an amount of equal to or greater than 0 weight percent and no more than 40 weight percent, based on the weight of the curable phenoxyphenyl polysiloxane composition;
 the combination of the reactive diluent and the inert diluent the inert diluent is present in the curable phenoxyphenyl polysiloxane composition in an amount of greater than 0 weight percent and no more than 40 weight percent, based on the weight of the curable phenoxyphenyl polysiloxane composition; and
 the diluent has a viscosity of at least 1 centipoise and no more than 10,000 centipoise;

E. optionally, providing a hydrosilation inhibitor in an amount in an amount sufficient to inhibit hydrosilation under conditions of shipment and storage of the curable phenoxyphenyl polysiloxane composition;

F. combining the multialkenyl phenoxyphenyl polysiloxane, the multihydrido silicon compound, the hydrosilation catalyst, the optional diluent, and the optional hydrosilation inhibitor to form a curable phenoxyphenyl polysiloxane composition; and G. curing the curable phenoxyphenyl polysiloxane composition.

The terminology of this specification includes words specifically mentioned herein, derivatives thereof, and words of similar import.

Used herein, the following terms have these definitions:

The words "a" and "an" as used in the specification mean "at least one", unless otherwise specifically stated.

"Range". Disclosures of ranges herein take the form of lower and upper limits. There may be one or more lower limits and, independently, one or more upper limits. A given range is defined by selecting one lower limit and one upper limit. The selected lower and upper limits then define the boundaries of that particular range. All ranges that can be defined in this way are inclusive and combinable, meaning that any lower limit may be combined with any upper limit to delineate a range. For example, if ranges of 60 to 120 and 80 to 110 are recited for a particular parameter, it is understood that the ranges of 60 to 110 and 80 to 120 are also contemplated. Additionally, if minimum range values of 1 and 2 are recited, and if maximum range values of 3, 4, and 5 are recited, then the following ranges are all contemplated: 1 to 3, 1 to 4, 1 to 5, 2 to 3, 2 to 4, and 2 to 5.

It will be appreciated by those skilled in the art that changes could be made to the suitable methods and compositions specifically described herein without departing from the broad inventive concept thereof. It is understood, therefore, that this invention is not limited to the particular suitable methods and compositions disclosed, and that recitation thereof is intended to additionally cover modifications within the spirit and scope of the present invention as disclosed herein and as defined by the appended claims.

A "silicon bonded organic group" is an organic group bonded to a silicon atom, wherein an "organic group" contains at least one carbon, or is a hydrogen atom or hydroxy group. Note that, for convenience of reference, the definition of "organic group" extends to include hydrogen atom (alternatively, hydrogen or hydrogen atom) and hydroxy group (alternatively, hydroxy or OH).

A "silicon bonded aryl group" ("silicon bonded aryl") is an aryl group having a carbon of an aromatic ring directly bonded to a silicon atom. Other suitable silicon bonded organic groups include, for example: "silicon bonded alkylene group" ("silicon bonded alkylene"); "silicon bonded hydrogen atom" ("silicon bonded hydrogen"); "silicon bonded alkyl group" ("silicon bonded alkyl"); "silicon bonded alkoxy group" ("silicon bonded alkoxy"); "silicon bonded aralkoxy group" ("silicon bonded aralkoxy"); "silicon bonded hydroxy group" ("silicon bonded hydroxy"); "silicon bonded (meth)acryloxy group" ("silicon bonded (meth)acryloxy"); "silicon bonded acetoxy group" ("silicon bonded acetoxy"); and combinations thereof. A "silicon bonded phenoxyphenyl group" ("silicon bonded phenoxyphenyl") is an example of a silicon bonded aryl group. Herein, silicon bonded aryl group is further subdivided into "phenoxyphenyl group" and "aryl group other than phenoxyphenyl".

A "silicon bonded phenoxyphenyl group" is a silicon bonded aryl group having a carbon atom of a phenyl ring directly bonded to a silicon atom and another carbon of the same phenyl ring directly bonded to an oxygen atom of a "phenoxy substituent". That oxygen atom is therefore an "ether linkage" of the silicon bonded phenoxy phenyl group.

The terms "mole percent", "molar percentage", and "mol %" are used interchangeably throughout. The "mol % of silicon bonded phenoxyphenyl groups" for a given silicon compound, for example a polysiloxane or a silane, is the number of moles of silicon bonded phenoxyphenyl groups contained in that silicon compound, divided by the number of moles of all silicon bonded organic groups, wherein the resultant molar fraction is then multiplied by 100%. For example, a hydrido silicon compound having 8 silicon bonded phenoxyphenyl groups and 2 silicon bonded hydrogen atoms, for a total of 10 silicon bonded organic groups, contains 80 mol % silicon bonded phenoxyphenyl groups, based on total silicon bonded organic groups of the hydrido silicon compound.

A "silicon bonded alkenyl group" ("silicon bonded alkenyl") is a silicon bonded hydrocarbon radical bearing an ethylenically unsaturated group. The silicon bonded alkenyl group is $CH_2=CH-X_s-$ wherein $s=0$ or 1, and X is selected from: linear, branched, or cyclic $C_1$-$C_{16}$ alkyl, o-phenyl, m-phenyl, p-phenyl, and combinations thereof. Therefore, for convenience, the definition alkenyl extends herein to include not only terminally unsaturated hydrocarbons in which the terminal double bond is either directly bonded to a silicon atom or connected to a silicon atom through an intervening $C_1$-$C_{16}$ alky, but also styryl groups. Examples of silicon bonded alkenyl groups include: vinyl, allyl, 5-hexen-1-yl, o-styryl, m-styryl, p-styryl, and combinations thereof. The "terminal double bond" is separated from the silicon atom by zero, or one or more intervening saturated carbon atoms and is a mono-substituted double bond. Alternatively, the terminal double bond is separated from the silicon atom by an intervening phenyl group. Further examples of "$C_4$-$C_{18}$ terminal alkenyl" include 5-hexen-1-yl and 3-methyl-6-hepten-1-yl.

A "multi-linkable precursor" is a precursor compound including two or more reactive groups capable of reacting with a "complementary reactive group" of another precursor. A "complementary reactive group" is a reactive group capable of reacting with another reactive group (i.e., another complementary reactive group able to react with the first complementary reactive group) to form a covalent bond linking precursor components during curing of a curable phenoxyphenyl silicon composition. The reactive groups of a multi-linkable precursor may be the same or different. For example, one multi-linkable precursor might include two identical or different silicon bonded alkenyl groups, while another multi-linkable precursor of the same curable phenoxyphenyl polysiloxane composition might include three silicon bonded hydrogen atoms. In the presence of a hydrosilation catalyst, these two precursors can be incorporated into a "crosslinked polysiloxane network" by hydrosilation. In an alternative example, one multi-linkable precursor includes one silicon bonded alkenyl group and one silicon bonded methoxy group, while another precursor includes one silicon bonded hydrogen atom and one silicon bonded methoxy group. In this alternative example, crosslinking can be achieved by a combination of reacting a silicon bonded alkenyl group with a silicon bonded hydrogen atom in the presence of a hydrosilation catalyst to form a silicon-bridging alkylene moiety, and moisture induced reaction of methoxy groups to form an Si—O—Si linkage. One of skill in the art will recognize that all or a portion of the reactive groups of a multi-linkable precursor may actually react with complementary reactive groups of another, or same, multi-linkable precursor. The degree to which reaction of all groups occurs will be dependent upon such factors as relative amounts of complementary reactive groups, details of curing conditions, and accessibility of reactive groups as molecular weight and degree of crosslinking increase during curing of the curable phenoxyphenyl polysiloxane composition. The multialkenyl phenoxyphenyl polysiloxane of the present invention is an example of a multi-linkable precursor useful in forming the alkylene-bridged phenoxyphenyl polysiloxane of the cured phenoxyphenyl polysiloxane composition. An example of a multi-linkable precursor for the multialkenyl phenoxyphenyl polysiloxane is dimethoxy phenoxyphenyl phenyl silane.

A "mono-linkable precursor" is a precursor compound including only one reactive group capable of reacting with a "complementary reactive group" of another precursor.

A "hydrido silicon compound" is a silicon containing compound having a silicon bonded hydrogen atom. A "multihydrido silicon compound" includes at least two silicon bonded hydrogen atoms.

A "monohydrido silicon compound" includes only one silicon bonded hydrogen atom.

A "multialkenyl phenoxyphenyl polysiloxane" is a polysiloxane including at least two silicon bonded alkenyl and at least one silicon bonded phenoxyphenyl.

A "monoalkenyl phenoxyphenyl polysiloxane" is a polysiloxane including only one silicon bonded alkenyl and at least one silicon bonded phenoxyphenyl.

A "silicon-bridging alkylene moiety" is a linking group which forms a bridge between two silicon atoms. The silicon-bridging alkylene moiety is formed by the hydrosilation reaction of the carbon-carbon double bond of a silicon bonded alkenyl group with an Si—H bond of a hydrido silicon compound. During the hydrosilation reaction, the Si—H bond is broken such that the silicon atom of that bond, along with any groups associated with that silicon atom, adds to one carbon of the alkenyl double bond and the hydrogen atom adds to the other carbon of the alkenyl double bond, converting that double bond to a single bond. A silicon-bridging alkylene moiety, therefore, contains the single bond derived from an alkenyl double bond through hydrosilation, along with other atoms creating a link between the silicon atom to which the alkenyl group had been bound and the silicon atom to which the hydrogen atom had been bound. For example, when the alkenyl group is an allyl group, the bridge (that is, the most direct link between the two silicon atoms) contains three carbons, two derived from the allylic double bond and one derived from the allylic methylene (i.e., —$CH_2$—). The silicon-bridging alkylene group further contains the substituents that were attached to the silicon bonded alkenyl group before the hydrosilation reaction occurred, as well as the hydrogen atom donated by the Si—H group.

The term "primary siloxane unit" refers to a portion of a polysiloxane containing a single silicon atom, wherein that silicon atom is directly bonded to between one and four oxygen atoms, and each of those oxygen atoms is, in turn, bonded to another silicon atom of an adjacent primary siloxane unit. An additional example beyond this Si—O—Si case is Si—Z—Si (see description infra). For example, $(CH_3)_3$Si—O—Si$(CH_3)_3$ is a polysiloxane having two primary siloxane units. Each primary siloxane unit has a single silicon atom bonded to three methyl groups and one oxygen atom, such that the oxygen atom is bound to both silicon atoms. Each of the two primary siloxane units of $(CH_3)_3$Si—O—Si$(CH_3)_3$ is defined infra as an "M-unit". In a second example, $(CH_3)_3$Si—O—Si$(CH_3)_2$OH is also a polysiloxane having two primary siloxane units, each of which has a single silicon atom bonded to the same single oxygen atom wherein that oxygen atom is bonded to a second silicon atom. The oxygen of the hydroxy group is not bonded to a second silicon atom and, as such, is not counted as a second oxygen atom for the purpose of determining if the primary siloxane unit to which it belongs is an M-unit or a D-unit. Therefore, the hydroxy group is treated as a silicon bonded organic group and the primary siloxane unit to which it belongs is an M-unit. It should be noted that, if $(CH_3)_3$Si—O—Si$(CH_3)_2$OH were, for example, reacted with $(CH_3)_3$Si—$OCH_3$, to form $(CH_3)_3$Si—O—Si$(CH_3)_2$—O—Si$(CH_3)_3$ then the primary siloxane unit initially bearing the hydroxy group would be converted from an M-unit to a D-unit because the oxygen atom would then be bound to not one, but two silicon atoms.

For the cured phenoxyphenyl polysiloxane composition, the silicon-bridging alkylene group (i.e., "Z" in Formula I below) of Si—Z—Si is treated as if it were an oxygen of Si—O—Si when determining whether a preliminary siloxane unit is an M-, D-, T-, or Q-unit. For example, if $(CH_3)_3$Si—O—Si$(CH_3)_2$CH=$CH_2$ were reacted with $(CH_3)_3$Si—H, to form $(CH_3)_3$Si—O—Si$(CH_3)_2$—$CH_2CH_2$—Si$(CH_3)_3$ then the primary siloxane unit initially bearing the alkenyl group (in this case, vinyl) would be converted from an M-unit to a D-unit because the alkylene bridge thus formed would then be bound to not one, but two silicon atoms. Taking the silicon bridging alkylene group Z into consideration, the product of that hydrosilation, $(CH_3)_3$Si—O—Si$(CH_3)_2$—$CH_2CH_2$—Si$(CH_3)_3$, contains two M-units in terminal positions and one interior D-unit, O—Si$(CH_3)_2$—$CH_2CH_2$ because each of the oxygen and the ethylene is further bonded to an adjacent silicon atom.

A "polysiloxane" is a siloxane having at least two primary siloxane units.

The term "M-unit" refers to a primary siloxane unit of a polysiloxane, wherein the silicon of that unit is attached to: a single, immediately adjacent, —O—Si— moiety through a covalent bond to the oxygen atom of that —O—Si— moiety; or a single, immediately adjacent, —Z—Si— moiety.

Similarly, the term "D-unit" refers to a primary siloxane unit of a polysiloxane wherein the silicon of that unit is attached to: two immediately adjacent —O—Si— moieties; two immediately adjacent —Z—Si— moieties; or one of each type of moiety.

Similarly, the term "T-unit" refers to a primary siloxane unit of a polysiloxane wherein the silicon of that unit is attached to: three immediately adjacent —O—Si— moieties; three immediately adjacent —Z—Si— moieties; or combinations of the two types of moieties, totaling three.

Similarly, the term "Q-unit" refers to a primary siloxane unit of a polysiloxane wherein the silicon of that unit is attached to: four immediately adjacent —O—Si— moieties; four immediately adjacent —Z—Si— moieties; or combinations of the two types of moieties, totaling four.

The term "ppm" means "parts per million" which, in turn, means "weight parts per million weight parts". Parts per million are weight based. Therefore, the amount, in parts per million, of a given component x in a composition y is calculated by dividing the weight of component x by the weight of composition y and then multiplying by one million. For example, if 0.002 gram of platinum metal is present in 1000 grams of a cured phenoxyphenyl polysiloxane composition, the Pt metal is present at 2 ppm, based on the total weight of that cured phenoxyphenyl polysiloxane composition.

A "curable phenoxyphenyl polysiloxane composition" of the present invention includes: a "multialkenyl phenoxyphenyl polysiloxane"; a "multihydrido silicon compound"; and a hydrosilation catalyst. The "multialkenyl phenoxyphenyl polysiloxane" of the present invention includes at least two alkenyl groups and at least one phenoxyphenyl group. The "multihydrido silicon compound" includes at least two hydrogen-silicon bonds (i.e., Si—H bonds) and, optionally, one or more phenoxyphenyl groups. The curable phenoxyphenyl polysiloxane composition may, optionally, include a "monoalkenyl phenoxyphenyl polysiloxane" having only one alkenyl group, a "monohydrido silicon compound" having only one silicon bonded hydrogen, or combinations thereof. The multialkenyl phenoxyphenyl polysiloxane and the multihydrido silicon compound are "multi-linkable precursors" for preparation of the alkylene-bridged phenoxyphenyl polysiloxane. The monoalkenyl phenoxyphenyl polysiloxane and the monohydrido silicon compound are "mono-linkable precursors". Herein, the term "alkenyl phenoxyphenyl polysiloxane precursor" includes both "multialkenyl phenoxyphenyl polysiloxane" and "monoalkenyl phenoxyphenyl polysiloxane". Further, the term "hydrido silicon precursor" includes both "multihydrido silicon compound" and "monohydrido silicon compound". The term "linkable precursor" includes both "mono-linkable precursor" and "multi-linkable precursor".

A multialkenyl phenoxyphenyl polysiloxane may, optionally, include one or more silicon bonded hydrogen atoms. When a multialkenyl phenoxyphenyl polysiloxane includes two or more silicon bonded hydrogen atoms, it may function as both the multialkenyl phenoxyphenyl polysiloxane and the multihydrido silicon compound of the present invention. In this case, the requirement that the curable phenoxyphenyl polysiloxane composition of the present invention included both a multialkenyl phenoxyphenyl polysiloxane and a multihydrido silicon compound can be met by a single compound. Therefore, disclosures of curable phenoxyphenyl polysiloxane compositions herein referring to both a multialkenyl phenoxyphenyl polysiloxane and a multihydrido silicon compound include the case in which a multialkenyl phenoxyphenyl polysiloxane and a multihydrido silicon compound are the same compound.

The "cured phenoxyphenyl polysiloxane composition" of the present invention, containing an "alkylene bridged phenoxyphenyl polysiloxane", may be formed from the curable phenoxyphenyl polysiloxane composition by a variety of curing methods well known in the art. Therefore, one or more of the silicon bonded groups of a given silicon-based precursor component will reflect the method by which all or a portion of that silicon-based precursor component will become incorporated into the alkylene bridged phenoxyphenyl polysiloxane. For example, the method of hydrosilation requires that a silicon bonded alkenyl group be available to react with a silicon bonded hydrogen. Similarly, when the curing method further includes moisture curing, silicon bonded methoxy (or other alkoxy), acetoxy, hydroxy, and combinations thereof are illustrative functional groups. Another technique is thermal or ultraviolet light curing of reactive, silicon bonded groups such acrylic and methacrylic groups.

A "diluent" is a low viscosity compound which is added to the curable phenoxyphenyl composition of the present invention to lower the viscosity of that curable phenoxyphenyl composition. A "reactive diluent" is a diluent capable of reacting with one or more of the components of the curable phenoxyphenyl composition under the conditions of curing. An "inert diluent" is a diluent that does not react with any other component of the curable phenoxyphenyl composition under the conditions of curing.

The curing method of the present invention is a hydrosilation method. A "hydrosilation catalyst" includes a Group VIII element selected from platinum, rhodium, palladium, ruthenium, iridium, or combinations thereof, and is capable of catalyzing the addition of an Si—H group across the double bond of an alkenyl group. One of skill in the art will recognize that, for a hydrosilation catalyst to be effective, it is important that none of the precursor components acts to significantly degrade the performance of that hydrosilation catalyst. When such degradation of performance does occur in a curable phenoxyphenyl polysiloxane composition, the composition will typically be modified by removal of the component causing the degradation. An exception is the deliberate addition of a "hydrosilation catalyst inhibitor" ("catalyst inhibitor") which may be included to extend the storage life of a curable aryloxyaryl polysiloxane composition. Catalyst inhibitors are discussed infra.

The practitioner will recognize that alkenyl phenoxyphenyl polysiloxane and hydrido silicon compound of the present invention may contain other types of reactive silicon bonded organic groups which are "linkable groups", including silicon bonded methoxy (or other alkoxy), acetoxy, hydroxy, acryloyl, methacryloyl, and combinations thereof. Further, an alkenyl phenoxyphenyl polysiloxane may include one or more silicon bonded hydrogen atoms.

A "high RI nanoparticle" is a particle having a refractive index ("RI") of at least 1.8 to no more than 3.5. Plural high RI nanoparticles have an "average particle diameter" of at least 1 nm and no more 30 nm.

A "Group VIII element equivalent value" expresses the amount of a hydrosilation catalyst present in a curable phenoxyphenyl polysiloxane composition or cured phenoxyphenyl polysiloxane composition, in terms of the amount of Group VIII element present in that composition. If, for example, a given hydrosilation catalyst, itself containing 50 weight percent of a Group VIII element, is present in a curable phenoxyphenyl silicon composition in an amount of 10 ppm, then the amount of hydrosilation catalyst present in that composition, "expressed as a Group VIII element equivalent value", is 5 ppm.

A suitable "silicon-bridging alkylene moiety" is interchangeably "Z" or "—$CHR^4CHR^5$—$X_s$—", wherein at least one of the two carbons derived from the carbon-carbon unsaturated bond of an alkenyl phenoxyphenyl polysiloxane by hydrosilation (i.e., the carbon to which $R^4$ is bound) is covalently bound to a silicon atom of the alkylene bridged phenoxyphenyl polysiloxane. The other carbon (i.e., the carbon to which the $R^5$ group is bound) may be bound directly to another silicon (subscript s=0) or bound to another silicon through X (subscript s=1), wherein X is selected from methylene, $C_2$-$C_{16}$ saturated hydrocarbon radical, phenyl, and combinations thereof. In this way, a larger "Si—$CHR^4CHR^5$—$X_s$—Si moiety" is formed. The alkylene bridged phenoxyphenyl polysiloxane of the present invention must include at least one silicon-bridging alkylene moiety. A suitable alkylene bridged phenoxyphenyl polysiloxane of the present invention may further include two or more silicon-bridging alkylene moieties. Each of $R^4$ and $R^5$ is a hydrogen atom.

An "alkylene bridged phenoxyphenyl polysiloxane" is a component of a cured phenoxyphenyl polysiloxane composition. An "alkylene bridged phenoxyphenyl polysiloxane" is a phenoxyphenyl polysiloxane including: at least one silicon-bridging alkylene moiety; at least one primary siloxane unit derived from an "alkenyl phenoxyphenyl polysiloxane" and at least one primary siloxane unit derived from a "hydrido silicon compound". An "alkylene bridged phenoxyphenyl polysiloxane may, optionally, include a "reactive silicon bonded organic group" including silicon bonded alkenyl, silicon bonded hydrogen atom, silicon bonded alkoxy, silicon bonded aralkoxy, silicon bonded hydroxy, silicon bonded acetoxy, and combinations thereof. Alternatively, a suitable "alkylene bridged phenoxyphenyl polysiloxane may include no reactive silicon bonded organic groups.

When a "cured phenoxyphenyl polysiloxane composition" has been formed using hydrosilation, that cured phenoxyphenyl polysiloxane includes: an alkylene bridged phenoxyphenyl polysiloxane; and a hydrosilation catalyst. If it is desired that the cured phenoxyphenyl polysiloxane composition, containing a hydrosilation catalyst, not discolor, as determined by the accelerated heat aging test of the present invention, then the hydrosilation catalyst will typically be present in an amount of at least 0.005 ppm to no more than 3.0 ppm, expressed as a Group VIII element equivalent value, based on the weight of the cured phenoxyphenyl polysiloxane composition.

Uses for the cured phenoxyphenyl polysiloxane composition of the present invention include use as an encapsulant for high brightness light emitting devices (HBLEDs). In such case, the cured phenoxyphenyl polysiloxane must be stable for extended times (thousands of hours) at use temperatures of 100° C. to 130° C., or even higher, in air. A test of the capability of a cured phenoxyphenyl polysiloxane to perform without loss of properties is the "accelerated heat aging test" of the present invention. A cured phenoxyphenyl polysiloxane composition that passes the accelerated heat aging test does not discolor during 14 days of heat aging at 200° C. in air, as indicated by a CIE b value, determined using CIE 1976 L*a*b* $D_{65}$(illumination angle)/10(observation angle) color test method, of no more than 2.0 measured through a 0.6 millimeter thick specimen of the cured phenoxyphenyl polysiloxane composition after the heat aging. CIE denotes the International Commission on Illumination.

Synthetic polymers are almost always a mixture of chains varying in molecular weight, i.e., there is a "molecular weight distribution", abbreviated "MWD". For a homopolymer, members of the distribution differ in the number of monomer units which they contain. This way of describing a distribution of polymer chains also extends to copolymers. Given that there is a distribution of molecular weights, the most complete characterization of the molecular weight of a given sample is the determination of the entire molecular weight distribution. This characterization is obtained by separating the members of the distribution and then quantifying the amount of each that is present. Once this distribution is in hand, there are several summary statistics, or moments, which can be generated from it to characterize the molecular weight of the polymer.

The two most common moments of the distribution are the "weight average molecular weight", "$M_w$", and the "number average molecular weight", "$M_n$". These are defined as follows:

$$M_w = \Sigma(W_i M_i)/\Sigma W_i = \Sigma(N_i M_i^2)/\Sigma N_i M_i$$

$$M_n = \Sigma W_i / \Sigma(W_i/M_i) = \Sigma(N_i M_i)/\Sigma N_i$$

wherein:
$M_i$=molar mass of $i^{th}$ component of distribution
$W_i$=weight of $i^{th}$ component of distribution
$N_i$=number of chains of $i^{th}$ component,
and the summations are over all the components in the distribution. $M_w$ and $M_n$ are typically computed from the MWD as measured by Gel Permeation Chromatography (see the Experimental Section). The "MWD polydispersity" is equal to $M_w/M_n$.

Estimation of whether a polymer and another component (e.g., another polymer, or a solvent or other small molecule) will be miscible may be made according to the well-known methods delineated in D. W. Van Krevelen, Properties of Polymers, 3$^{rd}$ Edition, Elsevier, pp. 189-225, 1990. For example, Van Krevelen defines the total solubility parameter ($\delta t$) for a substance by:

$$\delta_t^2 = \delta_d^2 + \delta_p^2 + \delta_h^2,$$

wherein $\delta_d$, $\delta_p$, and $\delta_h$ are the dispersive, polar, and hydrogen bonding components of the solubility parameter, respectively. Values for $\delta_d$, $\delta_p$, and $\delta_h$ have been determined for many solvents, polymers, and polymer segments, and can be estimated using the group contribution methods of Van Krevelen. For example, to estimate whether a polymer having a given composition will be miscible with a particular solvent or other small molecule (e.g., having a molecular weight of approximately 500 or less), one calculates $\delta_t^2$ for the polymer and $\delta_t^2$ for the solvent. Typically, if the difference between the two, $\Delta\delta_t^2$, is greater than 25 (i.e., $\Delta\delta_t > 5$), then the polymer and the solvent will not be miscible.

If, instead, it is desired to determine whether two polymers, differing in composition, will be miscible, the same calculations may be carried out, but the predicted upper limit of $\Delta\delta_t^2$ for miscibility will decrease as the molecular weight of one or both of the polymers under consideration increases. This decrease is thought to parallel the decrease in entropy of mixing which occurs as the molecular weight of the components being mixed increases. For example, two polymers, each having a degree of polymerization of 100, will likely be immiscible even if the value of $\Delta\delta_t^2$ for their mixture is 9, or even 4 (i.e., $\Delta\delta t=3$, or even 2). Still higher molecular weight polymers may be immiscible at even lower values of $\Delta\delta t$. It is desirable that the precursor components present in the curable phenoxyphenyl polysiloxane composition of the present invention are miscible. For example, it is desirable that the multialkenyl phenoxyphenyl polysiloxane, the multihydrido silicon compound, and the hydrosilation catalyst contained in the curable phenoxyphenyl polysiloxane composition of the present invention, are miscible. It is further desirable that any diluent, reactive or inert, be miscible in the curable phenoxyphenyl silicon composition. Without wishing to be bound by any particular theory, it is thought that miscibility of the components of the curable phenoxyphenyl polysiloxane composition leads to more uniform application to substrates (e.g., surfaces of light-emitting semiconductor devices), more uniform curing to give a uniform cured phenoxyphenyl polysiloxane composition having better performance characteristics than if the precursor components had not been miscible. To estimate whether a multialkenyl phenoxyphenyl polysiloxane, having a given composition, will be miscible with a particular hydrido silicon-based precursor, having another composition, one calculates $\delta t^2$ for each. It will be understood that these calculations provide useful guidelines for one skilled in the art, greatly reducing the amount of experimentation required to achieve a desired result. It is, however, further recognized that the results of such calculations are estimates, and that some experimentation may be needed, in addition to those calculations, to determine particularly advantageous compositions for the curable phenoxyphenyl polysiloxane composition of the present invention. It is further understood that, when two components (e.g., two precursor components) of the curable phenoxyphenyl polysiloxane composition display borderline miscibility, or even immiscibility, the selection of a third component miscible with each of those two components may be effective to product a solution in which all three components are miscible. Any two precursor components of a curable phenoxyphenyl polysiloxane composition of the present invention will typically be soluble in that curable phenoxyphenyl polysiloxane composition when present in an amount of: greater than 0, at least 0.1, at least 0.5, or at least 1.0 weight percent; and no more than 99.9, no more than 90, no more than 50, no more than 10 weight percent, or no more than 5 weight percent, based on the weight of the curable phenoxyphenyl silicon composition. The hydrosilation catalyst is typically, though not necessarily, soluble in the curable phenoxyphenyl silicon composition at its use amount which is usually a few ppm or less, but may be as high as 100 ppm, or even 500 ppm or more. When high RI nanoparticles are further present as a component of a curable phenoxyphenyl polysiloxane composition, those nanoparticles will not be soluble in the composition. Therefore, the high RI nanoparticles must be well dispersed within the curable composition and, when optical transparency is important, the particle size of the nanoparticles must be low enough that the nanoparticles do not scatter light.

"Tg" is an abbreviation for "glass transition temperature". The glass transition temperature, Tg, of a polymer is the temperature at which a polymer transitions from a rigid, glassy state at temperatures below Tg to a fluid or rubbery state at temperatures above Tg. The Tg of a polymer is typically measured by differential scanning calorimetry (DSC) using the mid-point in the heat flow versus temperature transition as the Tg value. A typical heating rate for the DSC measurement is 20 Centigrade degrees per minute. The Tg of the multialkenyl phenoxyphenyl polysiloxane of the present invention is typically: at least −100 at least −80, at least −40, or at least −20° C.; or no more then 30, no more than 20, or no more than 10° C.

The curable phenoxyphenyl polysiloxane composition of the present invention includes a hydrosilation catalyst, and the hydrosilation catalyst includes an element from Group VIII of the Periodic Chart of the Elements, present as a metal (i.e., in zero valent elemental form) or as a metal compound (i.e., a metal, in a positive valence state, associated with one or more counter ions; or in an organometallic complex), wherein the element is selected from: platinum, rhodium, palladium, ruthenium, iridium, and combinations thereof; platinum, rhodium, palladium, and combinations thereof; palladium, platinum, and combinations thereof; or platinum. A non-exhaustive list of platinum compounds includes: platinum black; platinum halides such as platinum (II) chloride, $PtCl_4$, $H_2PtCl_4.6H_2O$, $Na_2PtCl_4.4H_2O$, reaction products of $H_2PtCl_4.6H2O$ with cyclohexane, and reaction products of chloroplatinic acid and monohydric alcohols (such as Lamoreaux Catalyst); platinum-olefin complexes, such as Karstedt's catalyst, platinum carbonyl cyclovinylmethylsiloxane complex, and platinum cyclovinylmethylsiloxane complex; platinum-alcohol complexes; platinum-alcoholate complexes; platinum-ether complexes; platinum-aldehyde complexes; platinum-ketone complexes, such as platinum bisacetoacetate; platinum carbene complexes, reaction products of platinum tetrachloride with olefins and amines; platinum-vinylsiloxane complexes such as platinum-1,3-divinyl-1,1,3,3-tetramethyldisiloxane complex; bis-(γ-picoline)-platinum dichloride; trimethylenedipyridine-platinum dichloride, dicyclopentadiene-platinum dichloride, cyclooctadiene-platinum dichloride; cyclopentadiene-platinum dichloride; bis(alkynyl)bis(triphenylphosphine)-platinum complex; bis(alkynyl)(cyclooctadiene)-platinum complex; dimethylsulfoxyethyleneplatinum (II) chloride; square planar cis-coordinated dialkyl platinum(II) complexes such as bis-(triphenylphosphite)dimethyl platinum(II); and combinations thereof.

The hydrosilation catalyst is present in the curable phenoxyphenyl polysiloxane composition of the present invention, in any amount effective to cause hydrosilation reaction between silicon bonded alkenyl groups of the multialkenyl phenoxyphenyl polysiloxane (and any other precursor components bearing an alkenyl group) and silicon bonded hydrogen atoms of the multihydrido silicon compound (and any other precursor components bearing a silicon bonded hydrogen atom). This amount, expressed as a Group VIII element equivalent value, will typically be: at least 0.005, at least 0.01, or at least 0.1 ppm; and no more than 500, no more than 100, no more than 10, no more than 3.0, no more than 2, less than 1, less than 0.6 ppm, or no more than 0.5 ppm, based on the weight of the curable phenoxyphenyl polysiloxane composition. The hydrosilation catalyst, and any derivatives thereof, are similarly present in the cured alkylene-bridged phenoxyphenyl polysiloxane composition in a combined amount, expressed as a Group VIII element equivalent value, of: at least 0.005, at least 0.01, or at least 0.1 ppm; and no more than 500, no more than 100, no more than 10, no more than 3.0, no more than 2, less than 1, less than 0.6 ppm, or no more than 0.5 ppm, based on the weight of the cured alkylene-bridged phenoxyphenyl polysiloxane composition. However, when it is further desired that the cured alkylene-bridged phenoxyphenyl polysiloxane pass the accelerated heat aging test (see supra), the hydrosilation catalyst is present in the curable phenoxyphenyl polysiloxane composition in an amount, expressed as a Group VIII element equivalent value, of: at least 0.005, at least 0.01, or at least 0.1 ppm; and no more than 3.0, no more than 2, less than 1, less than 0.6 ppm, or no more than 0.5 ppm, based on the weight of the curable phenoxyphenyl polysiloxane composition. Further, a suitable upper limit for the amount of the hydrosilation catalyst and derivatives thereof may even be 0.45 ppm or lower, expressed as a Group VIII element equivalent value. The hydrosilation catalyst, and any derivatives thereof, are then similarly present in the cured alkylene-bridged phenoxyphenyl polysiloxane composition in a combined amount, expressed as a Group VIII element equivalent value, of: at least 0.005, at least 0.01, or at least 0.1 ppm; and no more than 3.0, no more than 2, less than 1, less than 0.6 ppm, or no more than 0.5 ppm, based on the total weight of the cured alkylene-bridged phenoxyphenyl polysiloxane composition. Further, a suitable upper limit for the amount of the hydrosilation catalyst and derivatives thereof may even be 0.45 ppm or lower, expressed as a Group VIII element equivalent value. One skilled in the art will recognize that portions or all of a hydrosilation catalyst may be converted to "hydrosilation catalyst derivatives", including other catalytic species and inactive degradation products, during or after curing. Hence, the amounts of both hydrosilation catalyst and derivatives thereof, taken in combination, are expressed as a Group VIII element equivalent value.

Suitable hydrosilation catalysts of the present invention include discrete molecules (i.e., small molecules, or individual polymeric chains) in the curable phenoxyphenyl polysiloxane composition and in the cured alkylene-bridged phenoxyphenyl polysiloxane composition. Other suitable hydrosilation catalysts include Group VIII metal nanoparticles having an average particle diameter of at least 1 nm, at least 2 nm, or at least 5 nm; and no more than 30 nm, no more than 20 nm, or no more than 10 nm. Suitable hydrosilation catalysts may further be used in a microencapsulated form, wherein microcapsules include ultra fine particles of a thermoplastic resin such as a polyester resin or a silicone resin) containing the hydrosilation catalyst. The hydrosilation catalyst may also be used in the form of a clathrate compound such as cyclodextrin.

The "silicon bonded aryl group" of the present invention includes any group containing at least one aromatic ring bonded directly to a silicon atom, wherein the aromatic ring may be substituted or unsubstituted, provided that the aryl group is either inert to curing conditions or, if reactive, does not contribute to degradation of desirable properties of the cured alkylene-bridged phenoxyphenyl polysiloxane composition. A non-exhaustive list of silicon bonded aryl groups includes: phenyl; arylaryl such as biphenyl; alkyl phenyl groups having $C_1$-$C_{12}$ alkyl groups such as tolyl, xylyl, and ethyl-substituted phenyl; phenoxyphenyl groups which include o-phenoxyphenyl, m-phenoxyphenyl, and p-phenoxyphenyl; heteroatom phenyl groups having heteroatom substituents bonded to the phenyl ring as a monovalent substituent or as a ring-fused variant, such as arylimides; aralkyl groups such as benzyl or phenethyl; fused ring aryls such as naphthyl; and combinations thereof. A suitable silicon bonded aryl group may be selected from phenyl, biphenyl, naphthyl, o-phenoxyphenyl, m-phenoxyphenyl, p-phenoxyphenyl, and combinations thereof. A suitable silicon bonded aryl group may be further selected from phenyl, o-phenoxyphenyl, m-phenoxyphenyl, p-phenoxyphenyl, and combinations thereof. A suitable silicon bonded aryl group may be still further selected from phenyl, p-phenoxyphenyl, and combinations thereof. A suitable silicon bonded aryl group may further be selected from o-phenoxyphenyl, m-phenoxyphenyl, p-phenoxyphenyl, and combinations thereof. A suitable silicon bonded aryl group may be p-phenoxyphenyl. It is a requirement of the present invention that the curable alkenyl phenoxyphenyl polysiloxane and the cured alkylene-bridged phenoxyphenyl polysiloxane each contain at least one silicon bonded aryl group that is a phenoxyphenyl group selected from o-phenoxyphenyl, m-phenoxyphenyl, p-phenoxyphenyl, and combinations thereof. A silicon bonded aryl group that is not a phenoxyphenyl group is further termed a "silicon bonded aryl group other than phenoxyphenyl". For example, a silicon bonded phenyl group is a silicon bonded aryl group other than phenoxyphenyl.

The silicon bonded phenoxyphenyl group of the present invention may be ortho-phenoxyphenyl (ring structure a), meta-phenoxyphenyl (ring structure b), para-phenoxyphenyl (ring structure c), or combinations thereof. Substituent X in each of ring structures a, b, and c denotes the reference point of attachment of an atom or larger moiety that determines whether the phenoxyphenyl group is ortho-, meta-, or para-. For example, substituent X represents a silicon atom covalently bound to a phenyl ring of the phenoxyphenyl group for a silicon bonded phenoxyphenyl group, and further represents any other groups attached to silicon. Ortho-phenoxyphenyl, meta-phenoxyphenyl, and para-phenoxy phenyl may be present as the silicon bonded phenoxyphenyl group in any proportion relative to one another. The o-phenoxyphenyl group may be present in an amount of equal to or greater than 0 and less than or equal to 100 mole percent, based on total moles of silicon bonded phenoxyphenyl groups contained in the multialkenyl phenoxyphenyl polysiloxane of the present invention. Similarly, each of m- and p-phenoxyphenyl may be present in an amount of equal to or greater than 0 and less than or equal to 100 mole percent, based on total moles of silicon bonded phenoxyphenyl groups contained in the multialkenyl phenoxyphenyl polysiloxane. For example, a suitable mixture of phenoxyphenyl isomers has one isomer (o-, m-, or p-) present in an amount of: at least 33.3, at least 50, at least 70, or at least 90; and less than or equal to 100, no more than 99, or no more than 95 mole percent, based on total moles of silicon bonded phenoxyphenyl groups contained in the multialkenyl phenoxyphenyl polysiloxane. In another suitable multialkenyl phenoxyphenyl polysiloxane, the silicon bonded phenoxyphenyl is a single isomer (i.e., ortho-, meta-, or para-), or substantially a single isomer (i.e., having a isomeric purity of at least 99 mole percent).

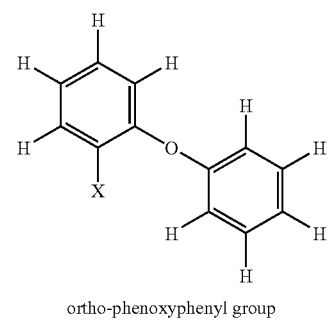

ring structure a ortho-phenoxyphenyl group attached to atom X

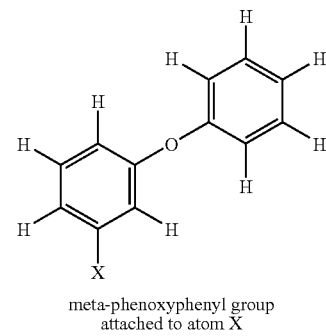

ring structure b meta-phenoxyphenyl group attached to atom X

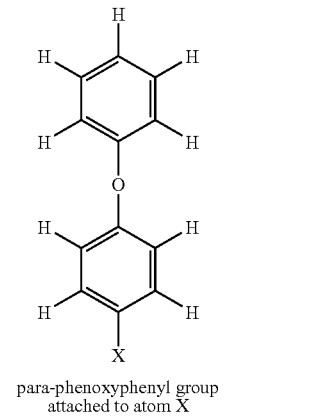

ring structure c para-phenoxyphenyl group attached to atom X

The "multialkenyl phenoxyphenyl polysiloxane" of the present invention includes at least two silicon bonded alkenyl groups. Silicon bonded alkenyl groups are present in the multialkenyl phenoxyphenyl polysiloxane in an amount of at least 1, or at least 5 mol %; and no more than 60, no more than 30, or no more than 10 mol %, based on the total silicon bonded organic groups of the multialkenyl phenoxyphenyl polysiloxane. Silicon bonded phenoxyphenyl groups are present in the multialkenyl phenoxyphenyl polysiloxane in an amount of equal to or greater than 0, at least 1, at least 10, at least 30, or at least 40 mol %; and no more than 99, no more than 90, no more than 80, or no more than 70 mol %, based on the total silicon bonded organic groups of the multialkenyl phenoxyphenyl polysiloxane.

Silicon bonded alkenyl groups of the present invention include: vinyl; terminally monoethylenically unsaturated $C_3$-$C_{18}$ linear, branched, or cyclic hydrocarbons such as allyl and hex-5-en-1-yl; vinyl substituted aryl groups such as p-vinylphenyl; and combinations thereof. A suitable silicon bonded alkenyl group may be further selected from vinyl, allyl, and combinations thereof. A suitable alkenyl group may further be vinyl.

The cured phenoxyphenyl polysiloxane composition comprising an alkylene-bridged phenoxyphenyl polysiloxane represented by the average compositional Formula I, $$(R^1_n SiO_{(4-n)/2})_a (O_{(4-p-r)/2} R^2_p SiZ_r SiR^3_q O_{(4-q-r)/2})_b \quad (I),$$

wherein:
each $R^1_n SiO_{(4-n)/2}$ is, independently, a primary siloxane unit selected from an M-unit, a D-unit, a T-unit, and a Q-unit;
for each $(R^1_n SiO_{(4-n)/2})$ unit:
subscript n equals independently 0, 1, 2, or 3;
each of the two primary siloxane units of $O_{(4-p-r)/2} R^2_p SiZ_r SiR^3_q O_{(4-q-r)/2}$ is, independently, selected from M-unit, D-unit, T-unit, and Q-unit;
for each $(O_{(4-p-r)/2} R^2_p SiZ_r SiR^3_q O_{(4-q-r)/2})$ unit:
subscript p equals 0, 1, 2, or 3;
subscript q equals 0, 1, 2 or 3;
p+q=0 to [8−(2r+1)];
subscript r=1, 2, or 3;
Z is —CHR$^4$CHR$^5$—X$_s$—, wherein:
—CHR$^4$CHR$^5$—X$_s$— is a silicon-bridging akylene moiety;
X is independently selected from: linear, branched or cyclic saturated $C_1$-$C_{16}$ hydrocarbon radical, o-phenyl, m-phenyl, p-phenyl, and combinations thereof;
subscript s=0 or 1; and
$R^4$ and $R^5$ are each a hydrogen atom;
$R^1$, $R^2$, and $R^3$ is a silicon-bonded organic group selected from alkenyl, hydrogen atom, aryl, alkyl, hydroxy, alkoxy, aryloxy, phenoxyphenyl, other organic radical, and combinations thereof;
the phenoxyphenyl is selected from o-phenoxyphenyl, m-phenoxyphenyl, p-phenoxyphenyl, and combinations thereof;
at least one of $R^1$, $R^2$, and $R^3$ is a silicon bonded phenoxyphenyl group;
subscripts a and b are selected to conform with the mole fraction of the $(R^1_n SiO_{(4-n)/2})$ unit and the $(O_{(4-p-r)/2} R^2_p SiZ_r SiR^3_q O_{(4-q-r)/2})$ unit, respectively;
0≤a<1; 0<b≤1; and
a+b=1;
wherein:
the M-unit is present in a molar fraction of at least 0.001 to equal and or less than 1,
the D-unit is present in a molar fraction of equal to or greater than 0 and no more than 0.999,
the T-unit is present in a molar fraction of equal to or greater than 0 and no more than 0.20,
the Q-unit is present in a molar fraction equal to or greater than 0 and no more than 0.10, each based on the total moles of primary siloxane units contained in the alkylene-bridged phenoxyphenyl polysiloxane; and
wherein:
when 0≤mole fraction T-unit≤0.03, 0≤mole fraction Q-unit≤0.03, and 0.00≤mole fraction (T-unit+Q-unit) ≤0.03, based on the total moles of primary siloxane units contained in the alkylene-bridged phenoxyphenyl polysiloxane,
the silicon bonded phenoxyphenyl group is present in an amount of at least 15 mole percent and no more than 99 mole percent, based on total moles of the silicon bonded organic groups of the alylene-bridged phenoxphenyl polysiloxane;
when 0≤mole fraction T-unit<0.07, 0≤mole fraction Q-unit<0.07, and 0.03<mole fraction (T-unit+Q-unit) <0.07, based on the total moles of primary siloxane units contained in the alkylene-bridged phenoxyphenyl polysiloxane,
the silicon bonded phenoxyphenyl group is present in an amount of at least 5 mole percent and no more than 99 mole percent, based on total moles of the silicon bonded organic groups of the multialkenyl phenoxyphenyl polysiloxane; and
when 0≤mole fraction T-unit≤0.20, 0≤mole fraction Q-unit≤0.10, and 0.07≤mole fraction (T-unit+Q-unit) ≤0.20, based on the total moles of primary siloxane units contained in the alkylene-bridged phenoxyphenyl polysiloxane,
the silicon bonded phenoxyphenyl group is present in an amount of greater than 0 mole percent and no more than 99 mole percent, based on total moles of the silicon bonded organic groups of the multialkenyl phenoxyphenyl polysiloxane.

Subscripts "a" and "b" represent mole fractions. For example, an alkylene bridged phenoxyphenyl polysiloxane having 7 $(R^1_n SiO_{(4-n)/2})$ units and 3 $(O_{(4-p-r)/2} R^2_p SiZ_r SiR^3_q O_{(4-q-r)/2})$ units would have Formula I "a" and "b" values or 0.7 and 0.3, respectively.

In a suitable alkylene-bridged phenoxyphenyl polysiloxane of Formula I, the mole percent of the combined R-groups, $R^1$, $R^2$, and $R^3$ which are selected from the silicon bonded organic groups alkenyl, hydrogen atom, methyl, phenyl, naphthyl, biphenyl, o-phenoxyphenyl, m-phenoxyphenyl, p-phenoxyphenyl, and combinations thereof, is at least 70, at least 90, or at least 95 mole percent; and equal to or less than 100, no more than 99, or no more than 97 mole percent, based on total moles of silicon bonded organic groups of the alkylene-bridged phenoxyphenyl polysiloxane. In another suitable alkylene-bridged phenoxyphenyl polysiloxane of Formula I, the mole percent of the combined R-groups, $R^1$, $R^2$, and $R^3$ which are selected from phenyl and phenoxyphenyl is at least 70, at least 90, or at least 95 mole percent; and equal to or less than 100, no more than 99, or no more than 97 mole percent, based on total moles of silicon bonded organic groups of the alkylene-bridged phenoxyphenyl polysiloxane. The composition of the precursor components present in the curable alkenyl phenoxyphenyl polysiloxane composition of the present invention will, of course, be chosen so that the mole percents recited for the cured composition are achieved.

The number average molecular weight, $M_n$, of the alkylene-bridged phenoxyphenyl polysiloxane of the present invention is at least 500, at least 1,000 g/mole, or at least 10,000 g/mole, and there is no particular upper limit, given that the alkylene-bridged phenoxyphenyl polysiloxane can be a single crosslinked molecule having an indeterminately high molecular weight, or can include two or more such highly crosslinked molecules. Herein, the term "link" means that two reactive silicon bonded organic groups having complementary reactivity (i.e., the ability to react with one another), and present as silicon bonded organic groups of a silicon-based precursor, have reacted to form a covalent bond (e.g., an alkylene bridge is formed by the reaction of a silicon bonded hydrogen atom with a silicon bonded vinyl, or an Si—O—Si linkage is formed by the reaction of a silicon bonded hydroxyl group with a silicon bonded alkoxy group). A "crosslink" is formed when at least one of the silicon atoms to which one of those reactive silicon bonded organic groups is attached has at least two covalent bonds to silicon-containing moieties (i.e., the silicon atom to which one of the reactive silicon bonded organic groups is attached is interior to a polysiloxane chain and not terminal to that chain). For example, a linear polysiloxane polymer having 10 silicon atoms in its linear polymeric chain and further having a hydroxy group attached to a silicon that is the third silicon from one end of that chain could be reacted with a second linear polysiloxane polymer having 10 silicon atoms in its linear polymeric chain and a methoxy group attached to a silicon that is the fifth silicon from one end of its chain. The result would be a polysiloxane which contains 20 silicon atoms, and further contains a link (i.e., a "crosslink") between the two chains. In this example, a silicon atom interior to one chain is joined through an oxygen atom to a silicon atom interior to the other chain, and each chain has a new "branch point". Polymeric networks may be formed by such crosslinking, and those networks may involve only one or a few crosslinks. Alternatively, networks of high, or even indeterminately high molecular weight may be formed containing many crosslinks. In another example, an interior silicon atom of one chain is joined to a terminal silicon atom of another chain, thus forming a branch point at the interior silicon atom of the first chain. The $M_n$ of a suitable alkylene-bridged phenoxyphenyl polysiloxane may be at least 500, at least 1,000 g/mole, or at least 10,000 g/mole; and no more than 300,000, no more than 200,000, no more than 50,000, no more than 10,000 g/mole; and the MWD polydispersity, $M_w/M_n$, may be at least 1.00, at least 1.01, at least 1.1, or at least 1.2; and no more than 50, no more than 20, no more than 10, or no more than 3. One of skill in the art will further recognize, that a suitable cured phenoxyphenyl polysiloxane composition may include a mixture of one or more very large crosslinked alkylene-bridged phenoxyphenyl polysiloxane molecules (i.e., having an $M_n$ of at least at least 300,000, at least 1,000,000, at least 2,000,000, or indeterminately high) with smaller alkylene-bridged phenoxyphenyl polysiloxane molecules, such that the MWD is bimodal, or multimodal. A suitable cured phenoxyphenyl polysiloxane composition may still further include one or more very large crosslinked alkylene-bridged phenoxyphenyl polysiloxane molecules having an $M_n$ of at least at least 300,000, at least 1,000,000, at least 2,000,000, or indeterminately high.

The multialkenyl phenoxyphenyl polysiloxane of the present invention is represented by average compositional formula II,

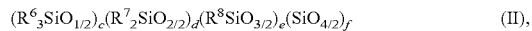

(II), wherein:
$R^6{}_3SiO_{1/2}$, $R^7{}_2SiO_{2/2}$, $R^8SiO_{3/2}$, and $SiO_{4/2}$ are, respectively, an M-unit, a D-unit, a T-unit, and a Q-unit, all of which are primary siloxane units;
each of $R^6$, each of $R^7$, and each of $R^8$ is, independently, a silicon bonded organic group selected from alkenyl, phenoxyphenyl, aryl other than phenoxyphenyl, alkyl, hydroxy, alkoxy, aryloxy, other organic radical, hydrogen, and combinations thereof;
at least two silicon bonded organic groups are alkenyl;
the alkenyl group is CH2=CH—Xs- wherein s=0 or 1, and X is independently selected from: linear, branched or cyclic saturated $C_1$-$C_{16}$ hydrocarbon radical, o-phenyl, m-phenyl, p-phenyl, and combinations thereof;
the alkenyl group is present in an amount of 1 mole percent to no more than 20 mole percent, based on total moles of the silicon bonded organic group of the multialkylene phenoxyphenyl polysiloxane;
at least one silicon bonded organic group is a phenoxyphenyl group selected from o-phenoxyphenyl, m-phenoxyphenyl, p-phenoxyphenyl, and combinations thereof;
the silicon bonded phenoxyphenyl group is present in an amount of greater than 0 mole percent and no more than 99 mole percent, based on the total moles of silicon bonded organic groups in the alkenyl phenoxyphenyl polysiloxane;
subscripts c, d, e, and f are selected to conform with the mole fractions of $R^6{}_3SiO_{1/2}$, $R^7{}_2SiO_{2/2}$, $R^8SiO_{3/2}$, and $SiO_{4/2}$, respectively;
0.001≤c≤1; 0≤d≤0.999; 0≤e≤0.20; 0≤f≤0.10; and c+d+e+f=1; and
the multialkylene phenoxyphenyl polysiloxane has:
  i) a number average molecular weight of at least 500 grams/mole and no more than 5,000 grams/mole; and
  ii) a viscosity of at least 10 and no more than 7,000,000 centipoise;
B. a multihydrido silicon compound having at least two silicon bonded hydrogen atoms; and
C. a hydrosilation catalyst in an amount effective to catalyze hydrosilation.

The multihydrido silicon compound of the present invention is selected from:
  i) a multihydrido silicon compound having the average compositional formula III,

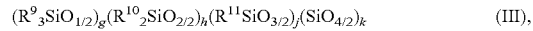

(III), wherein:
$R^9{}_3SiO_{1/2}$, $R^{10}{}_2SiO_{2/2}$, $R^{11}O_{3/2}$, and $SiO_{4/2}$ are, respectively, an M-unit, a D-unit, a T-unit, and a Q-unit, all of which are primary siloxane units;
subscripts g, h, j, and k are selected to conform with the mole fraction of $R^9{}_3SiO_{1/2}$, $R^{10}{}_2SiO_{2/2}$, $R^{11}SiO_{3/2}$, and $SiO_{4/2}$, respectively;
0≤g≤1; 0≤h≤1; 0≤j≤0.50; 0≤f≤0.10; and g+h+j+k=1;
at least two silicon bonded hydrogen atoms are present in the multihydrido silicon compound;
a silicon bonded hydrogen atom is present in the hydrido silicon compound in an amount of at least 1 mole percent and no more than 60 mole percent, based on total moles of the silicon bonded organic groups of the multihydrido silicon compound; and
each of $R^9$, each of $R^{10}$, and each of $R^{11}$ is, independently, a silicon bonded organic group selected from hydrogen atom, aryl other than phenoxyphenyl, alkyl, hydroxy, alkoxy, aryloxy, phenoxyphenyl, other organic radical, alkenyl, and combinations thereof; and
  ii) a hydrido silicon compound having the formula IV:

(IV)

wherein:
m=1 or 2; and
each $R^{12}$ is, independently, a silicon bonded organic group selected from aryl other than phenoxyphenyl, alkyl, hydroxy, alkoxy, aryloxy, phenoxyphenyl, other organic radical, alkenyl, and combinations thereof;
and combinations thereof.

The viscosity of the multialkenyl phenoxyphenyl polysiloxane of the present invention is: at least 10, or at least 100 centipoise; and no more than 7,000,000, no more than 3,000,000, no more than 1,000,000, no more than 100,000, no more than 10,000, or no more than 1,000 centipoise at 25° C. Typically, the viscosity of the curable phenoxyphenyl polysiloxane composition is: at least 10, or at least 100 centipoise; and no more than 100,000, no more than 50,000, no more than 10,000, or no more than 1,000 centipoise at 25° C. When a curable phenoxyphenyl polysiloxane composition is used in an application requiring good flow characteristics (e.g., when filling molds, or coating substrate surfaces), it is desirable that the curable phenoxyphenyl polysiloxane composition fill cavities completely and spread well across surfaces without spreading excessively or splashing. Often the temperature at which excellent flow characteristics are required will be an elevated temperature. For example, injection molding temperature may be as high as 50, 100, 150, or even higher than 150° C. In such case, suitable room temperature viscosities for the curable phenoxyphenyl polysiloxane composition may be well in excess of 100,000 centipoise (i.e., as high as 500,000, 1,000,000, or even higher) as long as, at critical use temperatures prior to, and in some cases during, curing the viscosity is: at least 100, at least 500, or at least 1,000 centipoise; and no more than 100,000, no more than 50,000, no more than 20,000, no more than 10,000, or no more than 5,000 centipoise.

A non-exhaustive list of illustrative multialkenyl phenoxyphenyl polysiloxanes includes: vinyldimethylsilyl-terminated poly[(phenoxyphenyl)phenylsiloxane], vinyldimethylsilyl-terminated poly[(phenoxyphenyl)methylsiloxane], vinyldiphenylsilyl-terminated poly[bis-(phenoxyphenyl)siloxane], vinylmethylphenylsilyl terminated poly[(phenoxyphenyl)phenylsiloxane-co-diphenylsiloxane]; vinylmethylphenylsilyl terminated poly[bis-(phenoxyphenyl)siloxane-co-diphenylsiloxane]; vinylmethylphenylsilyl terminated poly[bis-(phenoxyphenyl)siloxane-co-(phenoxyphenyl)phenylsiloxane]; and combinations thereof, wherein silicon bonded ortho-, meta-, and para-phenoxyphenyl groups may be present in any mole fraction with respect to one another (i.e., with respect to total phenoxyphenyl having a mole fraction of 1.00). Monoalkenyl phenoxyphenyl polysiloxanes may also be present in the curable phenoxyphenyl polysiloxane composition of the present invention.

Other multialkenyl aryl polysiloxanes which do not have silicon bonded phenoxyphenyl groups may further be present in the curable phenoxyphenyl polysiloxane composition of the present invention, along with at the multialkylene phenoxyphenyl polysiloxane of the present invention. A non-exhaustive list of illustrative alkylene aryl polysiloxanes includes: divinyldiphenyldimethyldisiloxane, 1,5-divinyl-1,5-dimethyl-tetraphenyltrisiloxane, 1,5-divinyl-hexaphenyltrisiloxane, vinyldimethylsilyl-terminated poly(phenylmethylsiloxane), vinyldimethylsilyl-terminated poly(phenylmethylsiloxane-co-diphenylsiloxane), vinylmethylphenylsilyl-terminated poly(phenylmethylsiloxane), vinylmethylphenylsilyl-terminated poly(phenylmethylsiloxane-co-diphenylsiloxane), vinyldimethylsilyl-terminated poly(phenylmethylsiloxane-co-vinylmethylsiloxane), vinyldimethylsilyl-terminated poly(phenylmethylsiloxane-co-diphenylsiloxane-co-vinylmethylsiloxane), vinylmethylphenylsilyl-terminated poly(phenylmethylsiloxane-co-vinylmethylsiloxane), vinylmethylphenylsilyl-terminated poly(phenylmethylsiloxane-co-diphenylsiloxane-co-vinylmethylsiloxane); and combinations thereof. Monoalkenyl aryl polysiloxanes which do not include phenoxyphenyl may also be present in the curable phenoxyphenyl polysiloxane composition of the present invention, as may multi- and mono-alkenyl polysiloxanes having no aryl groups.

Silicon bonded hydrogen atoms are present in the multihydrido silicon compound of the present invention in an amount of at least 1, at least 5 mol %, or at least 10 mol %; and no more than 60, no more than 40, or no more than 30 mol %, based on the total silicon bonded organic groups of the multihydrido silicon compound. The silicon bonded phenoxyphenyl group is present in the multihydrido silicon compound in an amount of: equal or greater than 0, at least 1, at least 10, at least 30, or at least 40 mol %; and no more than 99, no more than 90, no more than 80, or no more than 70 mol %, based on the total silicon bonded organic groups of the multihydrido silicon compound.

A non-exhaustive list of illustrative multihydrido silicon compounds includes, for example: hydride terminated poly[phenyl(dimethylhydrosiloxy)siloxane], hydride terminated poly[(phenoxyphenyl)phenylsiloxane], silanol terminated poly(diphenylsiloxane-co-methylhydrosiloxane), hydride terminated poly(methylhydrosiloxane-co-phenylmethylsiloxane), phenyltris(dimethylsiloxy)silane, phenylsilane, diphenylsilane, 1,3-diphenyl-1,1,3,3-tetrakis(dimethylsiloxy)disiloxane, and combinations thereof.

Groups $R^1$-$R^3$ and $R^6$-$R^{12}$ of the present invention are exemplified by the following lists. A non-exhaustive list of alkyl groups includes: methyl, $C_2$-$C_{12}$ alkyl wherein the alkyl portion is linear, branched or cyclic, such as ethyl, propyl, isopropyl, cyclohexyl, butyl, and isobutyl; fluorosubstituted alkyls such as 3,3,3-trifluoropropyl; and alkoxysubstituted alkyl such as methoxy methyl. The suitable alkyl group may be further selected from methyl or ethyl, and combinations thereof. The suitable alkyl group may be methyl. Alkenyl groups include: vinyl, allyl, $C_4$-$C_{18}$ terminal alkenyl such as hex-5-en-1-yl, vinylphenyl (i.e., a styrenic group bound to silicon through a covalent bond with a carbon of the phenyl ring), and combinations thereof. A suitable alkenyl group may be further selected from vinyl, allyl, styryl, and combinations thereof. A suitable alkenyl group may be still further selected from vinyl, allyl, and combinations thereof. The suitable alkenyl group may be vinyl. Alkoxy groups include, for example: methoxy, $C_2$-$C_{12}$ alkoxy wherein the alkyl portion is linear, branched or cyclic, such as ethoxy, propoxy, isopropoxy, butoxy, and t-butoxy. A suitable alkoxy group may be further selected from methoxy, ethoxy, and combinations thereof. The suitable alkoxy group may be methoxy. The aryloxy group may include, for example: phenoxy; phenoxy, wherein the phenoxy oxygen atom is bonded directly to a silicon atom, having one or more alkoxy, aryloxy, or fluorosubstitutents attached to the phenyl ring. These aryloxy groups, having an oxygen atom linking the aryl group with the silicon atom, are not to be confused with the phenoxyphenyl group of the present invention. One skilled in the art will recognize that "other organic radicals" beyond the types and specific groups listed supra, may be present as $R^1$-$R^3$ and $R^6$-$R^{13}$. Typically, these "other organic radicals" are present in an amount of 0 mol % to no more than 10 mol %, based on total moles of the silicon bonded organic groups present in the molecule. Even greater than 10 mol % of other organic radicals may be present, provided deleterious effects upon curing and characteristics of the cured alkylene-bridged phenoxyphenyl polysiloxane, such as resistance to heat aging, are minimal or non-existent. A non-exhaustive list of types of other organic radical includes moieties having these functional groups: amine, nitrile, ester, (meth)acryloyl, epoxy, amide, imide, and combinations thereof. Suitable curable and cured phenoxyphenyl polysiloxanes of the present invention may further include no "other organic radicals" in any of $R^1$-$R^3$ and $R^6$-$R^{12}$.

In the curable phenoxyphenyl polysiloxane composition of the present invention, the molar ratio of silicon bonded hydrogen atoms of the multihydrido silicon compound to the silicon bonded alkenyl groups of the multialkenyl phenoxyphenyl polysiloxane is at least 0.5, at least 0.8, or at least 1.0; and no more than 3.0, no more than 2.0, or no more than 1.5.

The refractive index of the cured phenoxyphenyl polysiloxane composition of the present invention is: at least 1.50, at least 1.55, at least 1.59, or at least 1.60; and no more 1.64, no more than 1.635, no more than 1.63, or no more than 1.62.

These limits for refractive index are limits in the absence of high RI additives such as high RI nanoparticles. Addition of high RI nanoparticles may increase the upper limits for refractive index of the cured phenoxyphenyl polysiloxane composition to no more than 2.5, no more than 2.1, or no more than 1.8.

The refractive index of the curable phenoxyphenyl silicon composition of the present invention is: at least 1.50, at least 1.55, at least 1.59, or at least 1.60; and no more 1.64, no more than 1.635, no more than 1.63, or no more than 1.62. These limits for refractive index are limits in the absence of high RI additives such as high RI nanoparticles. Addition of high RI nanoparticles may increase the upper limits for refractive index of the curable phenoxyphenyl silicon composition to no more than 2.5, no more than 2.1, or no more than 1.8.

It is an objective of the present invention that the curable phenoxyphenyl polysiloxane composition be sufficiently fluid to that it can fill mold cavities, and so that it can be coated onto the surface of a substrate, such as the light emitting surface of a light emitting semiconductor device. It has been found that effective control of the viscosity of the multialkenyl phenoxyphenyl polysiloxane of the present invention can be instrumental in assuring that the curable phenoxyphenyl polysiloxane composition will be sufficiently fluid (see viscosity ranges for the curable phenoxyphenyl polysiloxane supra) during processing prior to the curing step without resorting to the use of high levels of diluent, and, in some cases, without resorting to the use of any diluent at all. The ranges for the viscosity of the multialkenyl phenoxyphenyl polysiloxane necessary to produce the desired fluidity in the curable phenoxyphenyl polysiloxane composition are detailed supra. When it is further desired that the cured polysiloxane have a high refractive index, that is, in the range 1.59 to 1.64, substantial amounts of aryl groups are typically necessary to raise the refractive index. Unfortunately, a linear multialkenyl polysiloxane bearing enough silicon bonded phenyl groups to produce the requisite high refractive index is far too rigid to encourage fluidity in a curable polysiloxane composition of which it might be a component. However, it has been discovered that, when at least 15 mole percent of silicon bonded phenoxyphenyl groups, based on total silicon bonded organic groups, are contained in a linear multialkenyl phenoxyphenyl polysiloxane, the viscosity of that linear multialkenyl polysiloxane (i.e., a linear multialkenyl phenoxyphenyl polysiloxane) is sufficiently reduced such that fluidity is realized in curable compositions including it. There is no upper limit for the amount of silicon bonded phenoxyphenyl groups which may be present without compromising viscosity. That upper limit is dictated only by such considerations as the requirement that the linear multialkenyl phenoxyphenyl polysiloxane contain at least two alkenyl groups.

The linear multialkenyl phenoxyphenyl polysiloxane (supra) is represented by the average structural formula II of the present invention, wherein the sum of subscripts c+d=1, and each of subscripts e and f is equal to 0. That is, the linear polysiloxane contains only M-units and D-units. By definition, there is no branching. When T-units and/or Q-units are introduced, with accompanying branching, it is possible to use lower levels of silicon bonded phenoxyphenyl groups in the multialkenyl phenoxyphenyl polysiloxane while maintaining viscosity within the desired range. Therefore, when $0.00 \le e \le 0.03$, $0 \le f \le 0.03$, and $0.00 \le e+f \le 0.03$; the silicon bonded phenoxyphenyl group is present in an amount of at least 15, or at least 25 mole percent, and no more than 99, no more than 95, no more than 90, or no more than 80 mole percent, based on total moles of the silicon bonded organic groups of the multialkenyl phenoxyphenyl polysiloxane. Further, when $0 \le e < 0.07$, $0 \le f < 0.07$, and $0.03 < e+f < 0.07$; the silicon bonded phenoxyphenyl group is present in an amount of at least 5, at least 15, or at least 25 mole percent, and no more than 99, no more than 95, no more than 90, or no more than 80 mole percent, based on total moles of the silicon bonded organic groups of the multialkenyl phenoxyphenyl polysiloxane. Still further, when $0 \le e \le 20$, $0 \le f \le 10$, and $0.07 \le e+f \le 20$; the silicon bonded phenoxyphenyl group is present in an amount of greater than 0, at least 0.1, at least 1, at least 5, or at least 10 mole percent, and no more than 99, no more than 95, no more than 90, or no more than 80 mole percent, based on total moles of the silicon bonded organic groups of the multialkenyl phenoxyphenyl polysiloxane. The upper limit for the molar fraction of T-units (maximum mol %) and/or Q-units (maximum mol %) present in the multialkenyl phenoxyphenyl polysiloxane is dictated by the decrease in refractive index experienced when those T-units and Q-units are substituted for M-units or D-units with concomitant loss of high RI silicon bonded organic groups such as phenoxyphenyl and phenyl.

The practitioner will recognize that, once the lower limit for the amount of silicon bonded phenoxyphenyl groups has been satisfied for a given level of T- and Q-units such that flexibility of a multialkenyl phenoxyphenyl polysiloxane is achieved, other groups (see the definition of groups which may be $R^6$, $R^7$, and $R^8$ in Formula II supra) may be used as silicon bonded organic groups. In such case, it is advantageous if a substantial portion of these groups are groups capable of imparting high refractive index. Aryl groups are typically capable of imparting high refractive index, and the phenyl group is an example of such an aryl group. It is desirable that a multialkenyl phenoxyphenyl polysiloxane meeting the above criteria for amount of silicon bonded phenoxyphenyl groups, for amount of T-units and Q-units, and for refractive index further have a number average molecular weight, $M_n$, of: at least 500, at least 700 g/mole, or at least 1,000 g/mole; and no more than 5,000, no more than 4,000, no more than 3,000, or no more than 2,000 g/mole.

Ease of use is typically a crucially important performance characteristic of the curable phenoxyphenyl polysiloxane composition, with lower viscosities translating into increased flow with concomitant improvement in filling (e.g., of molds) and coating capability. While, without wishing to be bound be any particular theory, it is believed that the viscosity of the curable phenoxyphenyl polysiloxane composition is influenced by manipulating the quantity of silicon bonded phenoxyphenyl groups, the level of branching, and the molecular weight of the multialkenyl phenoxyphenyl polysiloxane, still further reduction of viscosity and hence improvement of desirable flow characteristics may be afforded by the introduction of a diluent, which may be a reactive diluent or an inert diluent. When it is desired to further reduce the viscosity of a curable phenoxyphenyl polysiloxane composition, a reactive diluent, an inert diluent, or combinations of reactive diluent and inert diluent may be added. The diluent of the present invention has a viscosity of: at least 1, at least 10, or at least 100 centipoise; and no more than 10,000, no more than 1,000, or no more than 500 centipoise. It is desirable that, when present, such diluents be present at a relatively low level, typically no more than that required to assure a particular viscosity for the curable phenoxyphenyl polysiloxane composition. A reactive diluent is, therefore, present in the curable phenoxyphenyl polysiloxane in an amount of: equal to or greater than 0, at least 0.1, at least 1, at least 2, or at least 5 weight percent; and no more than 30, no more than 25, no more than 15, or no more than 10 weight percent, based on the weight of the curable phenoxyphenyl polysiloxane composition. The inert diluent is present in the curable phenoxyphenyl polysiloxane in an amount of: equal to or greater than 0, at least 0.1, at least 1, at least 2, or at least 5 weight percent; and no more than 40, no more than 30, no more than 20, or no more than 10 weight percent, based on the weight of the curable phenoxyphenyl polysiloxane composition. When both reactive and inert diluent are present, the combined amount of reactive diluent and inert diluent is greater than 0, at least 0.1, at least 1, at least 2, or at least 5 weight percent; and no more than 40, no more than 30, no more than 20, or no more than 10 weight percent, based on the weight of the curable phenoxyphenyl polysiloxane composition.

The reactive diluent of the present invention is a diluent capable of becoming covalently bound to the alkylene-bridged phenoxyphenyl polysiloxane of the cured phenoxyphenyl polysiloxane composition. The reactive diluent is a compound including at least one reactive organic group, or other reactive group, capable of forming a covalent bond with at least one of: the alkylene-bridged phenoxyphenyl polysiloxane; the multihydrido silicon compound; other reactive compounds themselves capable of reacting with the alkylene-bridged phenoxyphenyl polysiloxane and/or the multihydrido silicon compound, during curing of the curable phenoxyphenyl polysiloxane composition, thus preventing the reactive diluent from volatilizing. Thus, when it is desired to decrease the viscosity of a curable polysiloxane composition, one may use, for example, compatible siloxanes with hydride and/or alkenyl attachment points when those siloxanes have molecular weights and/or viscosities lower than that of the base formulation for which a decrease in viscosity is desired. Reactive diluents are further disclosed in U.S. Pat. No. 4,234,713.

All solvents that are miscible with the curable phenoxyphenyl polysiloxane composition of the present invention or the cured phenoxyphenyl polysiloxane composition of the present invention, and which can be readily removed and are inert to those compositions (i.e., causing no deleterious change in performance characteristics of the cured phenoxyphenyl polysiloxane compositions during use) can be included as inert diluents in those compositions. A non-exhaustive list of inert diluents includes: Arene-based solvents such as toluene, xylenes, and anisole; ketones such as acetone; diaryl ether solvents such as diphenyl ether; dialkly ether solvents such as di-isopropyl ether and dibutyl ether; alkanes such as hexanes and octane; aryl or alkyl phosphites such as triphenyl phosphite or Irgafos 168; aryl or alkyl phosphates such as tricresyl phosphate or Santicizer 154; polyphenyl ether or polyphenyl thioethers such as Santovac SL5267 or SL5262; oligosiloxanes such as 1,1,5,5-tetraphenyl-1,3,3,5-tetramethyltrisiloxane, and assorted other oligosiloxanes which are miscible in the formulation. There are applications where it is desirable that the total polymer formulation have very little weight loss upon cure and use over the lifetime of the composition. For these applications a non-reactive diluent must be present in small amounts and/or must have a very high boiling point (low volatility). In some cases non-reactive diluents simply may not work due to this requirement, and a reactive diluent must be used instead. In other applications it is desirable that some solvent is released (spin-on coatings, solvent-borne coatings), and in those applications a non-reactive diluent is preferred.

An illustrative, non-exhaustive list of reactive diluents includes: diphenylsilane, divinylsiloxanes such as divinyltetramethyldisiloxane, divinyldiphenyldimethyldisiloxane, divinyldiphenyltetramethyltrisiloxane, diallyldiphenylsilane, divinyldiphenylsilane; phenylmethylvinylsilane, triphenylsilane, triphenylvinylsilane, phenyltris(dimethylsilyl)silane, diphenyltetrakis(dimethylsilyl)disiloxane, bis[(p-dimethylsilyl)phenyl]ether, bis(dimethylsilyl)benzene, phenylvinyl or phenylhydrido silsesquioxanes, phenylhydrocyclosiloxanes, and phenylvinylcyclosiloxanes. In general, molecules with 2 or more vinyl and/or hydride groups with a molecular weight below 1500 g/mol can be used to reduce viscosity in the compositions of the invention. In order for compositions to remain clear, these diluents must be miscible with the other components. However, reactive diluents which are slightly immiscible often become miscible as the system cures, giving an optically clear final composition.

Suitable curable phenoxyphenyl polysiloxane compositions of the present invention may be prepared prior to shipment to the location at which curing is to be accomplished, provided that premature curing and viscosity build are avoided during any intervening shipment and storage. For example, a suitable "one pot" composition includes curable phenoxyphenyl polysiloxane compositions having a low viscosity (e.g., typically no more than 100,000 centipoise at room temperature). The "one pot" composition should further include the hydrosilation catalyst at a level which is high enough that the curing step will occur efficiently when desired, and yet low enough to avoid viscosity build. Typically, a suitable one-pot composition will exhibit no more than a 20% increase in viscosity (i.e., viscosity build) during the intervening time period between preparation and use (i.e., curing) of the curable phenoxyphenyl polysiloxane composition. Optionally, an amount of a hydrosilation inhibitor effective to further assure suppression of premature curing may be included in the one pot curable phenoxyphenyl polysiloxane.

The cured phenoxyphenyl polysiloxane composition of the present invention may further include an additive. A non-exhaustive list of additives includes: nanoparticle or microparticle sized fillers such as ceria, titania, silica, zirconia, hafnium oxide, vanadium oxide, lanthanum oxide; anti-oxidants; hindered amine light stabilizers (HALS); lubricity additives; fungicides; flame retardants; contrast enhancers; UV-stabilizers; photostabilizers; surfactants; adhesive modifiers such as alkoxy-containing silanes, alkoxy-containing silicones, and epoxy silicones; phosphors; absorbing dyes; fluorescent dyes; electrical or thermal conductivity additives such as carbon nanotubes or nanoparticles; chelation or sequestration agents acid scavengers; base scavengers; and metal passivators and fortifiers such as fluorescing powders, nanotubes, nanospheres, nanoparticles, microspheres, pigments, liquid crystals, and clays.

High RI nanoparticles or other additives may be added to the curable phenoxyphenyl polysiloxane composition to raise its refractive index and the refractive index of the corresponding cured phenoxyphenyl polysiloxane composition. Such refractive index raising additives include, for example, ceria, titania, zirconia, hafnium oxide, vanadium oxide, lanthanum oxide, zinc oxide, tungstates, molybdates, niobium oxide, indium oxide, indium tin oxide, hexaphenyldisiloxane, tetraphenyllead, and tetraphenylsilane. The plural high RI nanoparticles of the present invention have an average particle diameter of at least 1 nm, at least 2 nm, or at least 5 nm; and no more than 30 nm, no more than 20 nm, or no more than 10 nm. When the application for the cured phenoxyphenyl polysiloxane composition requires high light transmission, it is a further requirement that the plural high RI nanoparticles not significantly diminish the light transmission of the specimen to a value below 90%. There is no particular limit to the particle size distribution polydispersity [PSD polydispersity= (weight average particle size/number average particle size)] for the plural high RI nanoparticles, however, the PSD polydispersity for the plural high RI nanoparticles is typically at least 1.00, at least 1.01, at least 1.1, or at least 1.2; and no more than 5, no more than 3, or no more than 2. The PSD (i.e., the distribution of particle diameters) may be unimodal or multimodal.

Furthermore, cure inhibitors, auxiliary catalysts, adhesion promoters, surface passivation agents, and passivation agents for mobile ionic species can be included in the curable phenoxyphenyl polysiloxane composition and in the cured phenoxyphenyl polysiloxane composition of the present invention. Cure inhibitors include, for example: acetylene alcohols such as 3-methyl-3-butyn-2-ol, 2-methyl-1-pentyn-3-ol, 3,5-dimethyl-1-hexyn-3-ol, 2,5-dimethyl-3-hexyn-2,5-diol, 3,6-dimethyl-4-octyne-3,6-diol, 2,4,7,9-tetramethyl-5-decyne-4,7-diol, and 3,7-dimethyl-6-octen-1-yn-3-ol ("dehydrolinalool" from BASF); triazoles; hydrosilanes such as 1,3-divinyl-1,1,3,3-tetramethyldisiloxane; dialkylformamides; alkylthioureas; methyl ethyl ketoxime; organosilicon compounds with aliphatic triple bonds and suitable boiling points; maleic monoesters; mixtures of diallyl maleate and vinyl acetate; nitrile compounds; and phosphorus compounds. Auxiliary catalysts include, for example metal oxides such as oxides of titanium, tin, zirconium, and lead. These same metal oxides may further be capable of acting as adhesion promoters. Passivation agents, typically preventing interaction with water by lowering surface energy, include, for example, poly[(3,3,3-trifluoropropyl)methylsiloxane], (3,3,3-trifluoropropyl)trimethoxysilane, (heptadecafluoro-1,1,2,2-tetrahydrodecyl)triethoxysilane, (tridecafluoro-1,1,2,2,-tetrahydrooctyl)trimethoxysilane, (tridecafluoro-1,1,2,2-tetrahydrooctyl)dimethylchlorosilane, and 3,5-bis(trifluoromethyl)phenyldimethylchlorosilane.

The method of making the multialkenyl phenoxyphenyl polysiloxane of the present invention is accomplished by combining starting materials wherein at least one of those starting materials includes one or more silicon bonded phenoxyphenyl groups, and wherein at least one of those starting materials includes one or more silicon bonded alkenyl groups. A given silicon containing starting material may contain both a phenoxyphenyl group and an alkenyl group, or one or the other type of group. There may, optionally, also be a silicon containing starting material useful for preparing the multialkenyl phenoxyphenyl polysiloxane of the present invention that contains neither a phenoxyphenyl group nor an alkenyl group. Typically, silicon bonded alkoxy groups, hydroxy groups, or both may further be present, providing a means of joining silicon containing compounds through the elimination of water or an alcohol. The relative proportions of M-units, D-units, T-units, and Q-units that will be contained in a multialkenyl phenoxyphenyl polysiloxane after it is prepared from the silicon containing starting materials can be controlled by choosing the number of such reactive silicon bonded groups attached to a given silicon atom of the silicon containing starting material. For example, a phenyl trimethoxy silane is capable of reacting with three silicon bonded hydroxy groups, each attached to a different silicon atom of one or more silicon containing starting materials to produce a larger compound in which the silicon provided by the phenyl trimethoxy silane is part of a T-unit. In like manner, tetraethoxy silane could react to create a Q-unit. Of course, reaction of fewer than all of the reactive groups leads to a primary siloxane unit having fewer than the maximum possible —O—Si— attachments. For example, incomplete reaction of the Si—OEt groups of a tetraethoxy silane could lead to formation of a T-unit, a D-unit, or an M-unit. An alternative route to creating T-units and Q-units for branching is to utilize a silicon containing starting material that contains one or more silicon atoms which are already bound to three or four other silicon atoms through a shared oxygen atom. For example, the reaction of 1-methoxy-1,1-dimethyl-2,3,3,3-tetraphenyl-2-triphenylsiloxy-trisiloxane with another precursor bearing a hydroxy group adds a D-unit, a T-unit, and two M-units to the resulting polysiloxane product.

The practitioner will recognize that many of the precursor compounds for preparation of the multialkenyl phenoxyphenyl polysiloxane of the present invention are well known in the art, and many of those are commercially available. Preparation of phenoxyphenyl silicon compounds is further disclosed in U.S. provisional patent application U.S. 60/962,271. Further methods for the preparation of multialkenyl phenoxyphenyl polysiloxanes is disclosed in U.S. provisional patent application U.S. 60/872,094 and in U.S. provisional patent application U.S. 60/962,271.

The method of making the multihydrido polysiloxane of the present invention is accomplished by combining starting materials wherein at least one of those starting materials includes one or more silicon bonded hydrogen atoms. A given silicon containing starting material may contain a phenoxyphenyl group, an aryl group, a methyl group, or a hydrido group, or some combination of groups. There may, optionally, also be a silicon containing starting material useful for preparing the multihydrido polysiloxane of the present invention that contains neither a phenoxyphenyl group, an aryl group, a methyl group, or a hydrido group; or that contains only a subset of these groups. Typically, silicon bonded alkoxy groups, hydroxy groups, or both may further be present, providing a means of joining silicon containing compounds through the elimination of water or an alcohol. The relative proportions of M-units, D-units, T-units, and Q-units that will be contained in a multihydrido polysiloxane after it is prepared from the silicon containing starting materials can be controlled by choosing the number of such reactive silicon bonded groups attached to a given silicon atom of the silicon containing starting material. For example, a phenyl trimethoxy silane is capable of reacting with three silicon bonded hydroxy groups, each attached to a different silicon atom of one or more silicon containing starting materials to produce a larger compound in which the silicon provided by the phenyl trimethoxy silane is part of a T-unit. In like manner, tetraethoxy silane could react to create a Q-unit. Of course, reaction of fewer than all of the reactive groups leads to a primary siloxane unit having fewer than the maximum possible —O—Si— attachments. For example, incomplete reaction of the Si—OEt groups of a tetraethoxy silane could lead to formation of a T-unit, a D-unit, or an M-unit. An alternative route to creating T-units and Q-units for branching is to utilize a silicon containing starting material that contains one or more silicon atoms which are already bound to three or four other silicon atoms through a shared oxygen atom. For example, the reaction of 1-methoxy-1,1-dimethyl-2,3,3,3-tetraphenyl-2-triphenylsiloxy-trisiloxane with another precursor bearing a hydroxy group adds a D-unit, a T-unit, and two M-units to the resulting polysiloxane product.

One of skill in the art will recognize that curing temperatures and times may be varied to accommodate specific curable phenoxyphenyl polysiloxane compositions, including hydrosilation catalyst levels. Typically, the curing temperature is selected such that a cured phenoxyphenyl polysiloxane composition is formed within a few minutes to several hours, and can be at least 100, at least 120, or at 140° C.; and no more than 270, no more than 250, no more than 220, no more than 200, or no more than 180° C. Suitable methods of making the cured phenoxyphenyl polysiloxane composition may further include curing temperatures above and below the extrema just stated. Curing temperatures below 100° C. may be desirable for particularly reactive systems or for curing reactions in the presence of sensitive electronic devices, while curing temperatures above 220° C. may be desirable for particularly unreactive systems that are also particularly stable to high temperatures during and after curing. Of course, characteristics of each curable phenoxyphenyl siloxane composition such as the volatility of components must also be considered when selecting curing conditions. It is further understood that the curing temperature may be varied during curing. For example, the curing temperature might be set initially to be 130° C., but programmed to rise to 150° C. during 2 hours, followed by an 8 hour final curing time interval at 180° C. Typically, the multialkenyl phenoxyphenyl polysiloxane and the hydrosilation catalyst will be combined prior to addition of the multihydrido silicon compound to assure uniform distribution of the hydrosilation catalyst prior to its interaction with silicon bonded hydrogen atoms. Such interaction in the absence of readily accessible multialkenyl phenoxyphenyl polysiloxane can lead to precipitation of products of that interaction, rendering difficult, or impossible, formation of a uniform, fully curable reaction mixture upon subsequent addition of that multialkenyl phenoxyphenyl polysiloxane. It is further possible to combine the hydrosilation catalyst with mixtures containing both the multialkenyl phenoxyphenyl polysiloxane and the multihydrido silicon compound of the present invention. The skilled practitioner will further recognize that addition of other ingredients, such as monoalkenyl polysiloxanes, monohydrido silicon compounds, reactive diluents, inert diluents, high RI nanoparticles, and hydrosilation inhibitors, should be accomplished in a manner that avoids deleterious effect on the resultant curable polysiloxane composition. Curing of curable aryl polysiloxane compositions, in particular using low levels of hydrosilation catalyst, is disclosed in U.S. provisional patent application U.S. 60/851,945, filed Oct. 16, 2006.

The cured phenoxyphenyl polysiloxane composition of the present invention can, of course, be formed in absence of any device, using the method of curing of the present invention by, for example: formation and curing of films; extrusion, or exudation of variously shaped articles; injection molding, and other mold based formation, of various shaped articles, (e.g., lenses, or films having patterned surfaces, such as light extraction films). When a device, such as a semiconductor device, is present during curing, it is necessary that a curing temperature be selected that does not damage the device. In such case, one or more semiconductor elements of the semiconductor device may be encapsulated to form an encapsulated semiconductor device by coating the semiconductor element with the curable phenoxyphenyl silicon composition before or during the step of curing. Alternatively, the cured phenoxyphenyl polysiloxane composition may be formed as, for example, a free-standing film and then applied to the device, with or without application of an intervening optical adhesive to bond the cured phenoxyphenyl polysiloxane to the substrate surface and with or without application of heat to promote bonding.

The cured phenoxyphenyl polysiloxane composition of the present invention has many uses, including for example underfiller, protective coating agent, potting agent, or adhesive agent (e.g., die-bonding applications) for electric and electronic products, including semiconductors. The cured phenoxyphenyl polysiloxane compositions is further useful to produce LED lenses and other LED optical equipment. There is no particular limit to the types of semiconductor that can be encapsulated. For example, light emitting diode (LED) devices can be encapsulated with the cured aryl polysiloxane of the present invention. The high light transmittance of the cured phenoxyphenyl polysiloxane composition makes it particularly suitable for use as an underfiller, protective coating agent, potting agent, or adhesive agent in semiconductor elements used for optical applications. Curable and cured phenoxyphenyl polysiloxane compositions can be of great utility in the field of contact and intraocular lenses. Maintaining the proper glass transition temperature ($T_g$) is a critical technical constraint of intraocular and contact lenses, but high transparency and refractive index is also desired. Thus curable and cured phenoxyphenyl polysiloxane compositions are useful for these applications due to their high RI and low $T_g$. Low viscosity curable phenoxyphenyl polysiloxane compositions are useful for casting molding lenses, including ophthalmic lenses, intraocular implants, contact lenses, and optical device lenses. Cured phenoxyphenyl polysiloxane compositions may also be used as high thermal conductivity heat transfer underfills for flip chip packaging.

The device of the present invention is characterized in that its semiconductor elements are coated with cured phenoxyphenyl polysiloxane composition, or are coated with the curable phenoxyphenyl polysiloxane composition, and then cured in place. Such semiconductor elements are exemplified by semiconductor elements used in diodes, transistors, thyristors, solid-state image pickup elements, monolithic integrated circuits ("ICs") and in hybrid ICs. In addition, such semiconductor devices are exemplified by diodes, light-emitting diodes (LEDs), transistors, thyristors, photocouplers, charge coupled devices (CCDs), monolithic ICs, hybrid ICs, large and very large scale integrated circuits (LSIs, and VLSIs).

EXPERIMENTAL

Some suitable aspects of the present invention will now be described in detail in the Examples which follow. Additional disclosure of methods of making and purifying phenoxyphenyl containing starting materials useful for preparing the alkenyl phenoxyphenyl polysiloxane of the present invention is found in provisional patent application U.S. 60/962,271. Additional disclosure of methods of making alkenyl phenoxyphenyl polysiloxanes, hydrido silicon compounds, curable phenoxyphenyl polysiloxane compositions, and cured phenoxyphenyl polysiloxane compositions is found in provisional patent application U.S. 60/872,094.

Materials.

Most siloxane monomers and polymers were purchased from Gelest, Inc. Solvents and other chemicals were purchased from Aldrich or Fisher Scientific. Chemicals were used as received. The platinum concentrations are calculated by doing x-ray fluorescence spectroscopy on the platinum stock solutions. Polymer molecular weights are determined by gel-permeation chromatography using polystyrene standards, and are therefore relative molecular weights. Table A is a listing of materials used in the examples.

TABLE A

Materials used in the examples.

| Material | CAS# | Supplier |
|---|---|---|
| 4-Bromodiphenylether | 101-55-3 | TCI America Aldrich, Milwaukee, Wisconsin |
| Tetraethoxysilane | 78-10-4 | Gelest, Morrisville, Pennsylvania |
| Phenyltrimethoxysilane | 2996-92-1 | Gelest |

TABLE A-continued

Materials used in the examples.

| Material | CAS# | Supplier |
|---|---|---|
| Diphenyldisilanol | 947-42-2 | Gelest |
| Diphenyldimethoxysilane | 6843-66-6 | Gelest |
| Triphenylsilanol | 791-31-1 | Gelest |
| Vinylphenylmethylmethoxysilane | 80252-60-4 | Gelest |
| Vinylphenylmethylsilane | 17878-39-6 | Gelest |
| 1,3-divinyltetramethyldisiloxane | 2627-95-4 | Gelest |
| Tetrabutylammonium hydroxide 40% in water | 2052-49-5 | Aldrich |

Molecular Weight Determination Using Gel Permeation Chromatography (GPC).

Gel Permeation Chromatography, otherwise known as size exclusion chromatography, actually separates the members of a distribution according to their hydrodynamic size in solution rather than their molar mass. The system is then calibrated with standards of known molecular weight and composition to correlate elution time with molecular weight. The techniques of GPC are discussed in detail in *Modern Size Exclusion Chromatography*, W. W. Yau, J. J Kirkland, D. D. Bly; Wiley-Interscience, 1979, and in *A Guide to Materials Characterization and Chemical Analysis*, J. P. Sibilia; VCH, 1988, p. 81-84.

Sample Preparation:

A known weight (approximately 0.025 g for each sample) of multialkenyl polysiloxane prepared according to the example number specified in Table 4 was place in a 20 mL vial. An amount of tetrahydrofuran (Certified grade from Fisher Scientific) was added to the vial, resulting in a concentration of the multialkenyl polysiloxane in the THF solution of about 3.0 mg/mL. Sample solutions were filtered using a 0.45 μm PTFE filter.

Sample Analysis:

Separations were carried out on a liquid chromatograph having an Agilent 1100 Model isocratic pump and autosampler (Waldbronn, Germany) and PL 1000 Model evaporative light scattering detector (ELSD) operated at $T_{NEB}=40°$ C., $T_{ECH}=80°$ C. and $F_{N2}=1$ L/min (Polymer Laboratories (Varian), Church Stretton, UK). System control, data acquisition, and data processing were performed using 3.0 version of CIRRUS™ software (Polymer Laboratories). SEC separations were performed in THF (certified grade) @ 1 ml/min using SEC column set composed of two PL columns (300× 7.8 mm ID) packed with polystyrene-divinylbenzene gel (pore size marked as "OLIGOPORE™", particle size 6 μm) purchased from Polymer Laboratories. The sample solution (25 μL) was subjected to SEC separation. c) Relative molecular weights of analyzed sample were calculated using both sample SEC chart and calibration curve (1st order fit) of PS standards. Average molecular weight data relative to PS standards are summarized in Table 4.

Nuclear Magnetic Resonance (NMR) Method for Determining Ratio of Silicon Bonded Vinyl Groups to Silicon Bonded Hydrogen Atoms.

NMR analysis, using a Bruker ADVANCE™ 500 MHz NMR Spectrometer, provides the gram equivalent weights of silicon bonded hydrogen atoms and vinyl components for formulating. The integrated proton NMR signal of vinylic or hydridic protons of a silicon containing compound is then compared to the integrated signals from a known quantity of a toluene standard by proton NMR. The quantity of vinyl or hydride protons can then be calculated on a weight basis. The vinyl content of the multialkenyl polysiloxanes was determined by placing a known amount (typically 0.05 g to 0.10 g) of multialkenyl polysiloxane into a 20 mL vial. CDCl$_3$ (1 mL) was added to dissolve the mulialkenyl polysiloxane. A known amount of toluene (typically 0.05 g) was then added to the vial. $^1$H NMR spectra were acquired and the g/mol of vinyl groups for each multialkenyl polysiloxane was calculated using the Si—CH3 or Si—HC═CH2 versus the toluene internal standard.

X-Ray Fluorescence (XRF) Method for Determining Platinum Concentration in Hydrosilation Catalyst Stock Solutions.

Hydrosilation catalyst stock solutions are prepared by dissolving a known amount of hydrosilation catalyst in a known amount of solvent (toluene or xylenes). Platinum concentrations are calculated by performing X-ray fluorescence (XRF) spectroscopy on hydrosilation catalyst stock solutions in toluene or xylenes. XRF measurements, using a Philips PW2404 Sequential Wavelength Dispersive XRF, are calibrated with known platinum standards. Calculated amounts (e.g., microliters delivered using a micropipette) of hydrosilation catalyst stock solution are first combined with an alkylene silicon-based precursor and then with a hydrido silicon-based precursor to form a curable phenoxyphenyl silicon composition. Hydrosilation catalyst stock solutions are prepared at multiple concentrations.

Viscosity Determination.

Samples were tested using a Rheometrics Fluids Spectrometer (RFS-II) using 0.25 mm gap parallel plate geometry. Depending on the viscosity of the fluid, 25 mm diameter or 50 mm diameter plate fixtures were employed. The larger diameter was used for low viscosity fluids, while the smaller diameter was used for more viscous fluids. Tests were conducted using a Dynamic Temperature Ramp mode at an applied frequency of 6.28 rad/s and an applied strain of 5%. A heating rate of 2° C./min was used from 25° C. to 50° C. The fixtures are zeroed at the starting temperature of 25° C. Sample was loaded onto the bottom plate, taking care to prevent bubble formation. The upper plate was lowered onto the sample to the desired gap of 0.25 mm. After initiating the test sequence, the complex viscosity ($\eta^*$) was recorded as a function of temperature. It was assumed that all fluids tested displayed Newtonian viscosity behavior ($\eta^*$ independent of frequency) over the range of temperatures. It was also assumed that the Cox-Merz rule $[\eta^*(\omega)=\eta(\dot{\gamma})$, for $\omega$ (Hz)=$\dot{\gamma}(s^{-1})]$ was applicable to these liquids. Since the liquids are assumed to be Newtonian, the measured viscosities correspond to the zero shear viscosities, $\eta(\dot{\gamma}=0)$, as a function of temperature. Using the values of the zero shear viscosity at selected temperatures, the flow activation energies of the test liquids could be determined.

Refractive Index Determination.

Refractive indices were determined for the silicon-based precursors formed in the synthetic reactions which follow using a Reichert Abbe Mark II Digital Refractometer having a white light source. A drop of liquid was placed in the apparatus, and the dial was rotated until a clear line was visible. The refractive index indicated on the dial was then recorded.

Laser Heat Aging of Cured Polysiloxane Compositions.

This test combines heat aging with simultaneous exposure to laser irradiation. Samples were prepared by curing films on glass slides with a thickness of about 1 mm. Specimens were placed in an specially built oven so that it had two ports (i.e., for entrance and exit) for the a laser beam to go through. The temperature of the oven was maintained at 200° C., and samples were kept in that oven for 15 days. During that time, the specimens were further exposed to the beam of an Argon ion laser (Innova I-90, Spectra Physics, Mountain View, Calif.) having a beam diameter of 1 mm² and having a wavelength of 476 nm and power of 360 mW for five 8-hour intervals, for a total of 40 hours exposure. Specimens were next exposed to the beam of an argon laser having a wavelength of 488 nm and a power of 480 mW during 8 intervals totaling another 45 hours of laser exposure. The combined total laser beam exposure was 85 hours. The transmitted light through the film/glass specimen was monitored with a Ocean Optics spectrometer USB 4000 and computer system (Dunedin, Fla.). Specimens were observed to detect any change in optical transmission for the duration of the laser exposure and elevated temperature.

Examples 1-8 and 10-16

Preparation of Multialkenyl Polysiloxanes

The following general procedure was carried out using components A-F, water and catalyst in the amounts listed in Table 1. Components A, B, C, D, E, and F were charged to a 30 mL reaction vessel equipped with a magnetic stirrer. [Note: The total number of components varied from 2 (i.e., A and B) to 6 (i.e., A-F)] Water and catalyst were added to the reaction vessel, and stirring was begun. The reaction mixture was heated to 85° C. and maintained at 85° C. for 4 hours. After 4 hours, the temperature was increased to 95° C. and maintained at 95° C. for one hour, followed by cooling to room temperature. The reaction mixture was then diluted with diethyl ether or toluene (30 to 50 mL). The organic solution was extracted twice with approximately equal volumes of 5% HCl in water and two times with approximately equal volumes of deionized water. Residual water in the organic solution was removed using anhydrous magnesium sulfate. The magnesium sulfate was then removed by filtration, and the filtrate was concentrated under reduced pressure to yield the multialkenyl polysiloxane. The calculated molar percentages for the silicon bonded organic groups (note that the hydroxy group is defined herein as an organic group) contained in the reactants used to prepare the multialkenyl polysiloxanes of Examples 1-16 are listed in Table 2. Note: The synthetic method for Example 9 is given infra. The calculated average compositions of alkenyl polysiloxanes produced in the reactions of Examples 1-16, using the assumption that all alkoxy and hydroxy groups react to form Si—O—Si bonds during formation, is recorded in Table 3. The compositional information includes calculated molar percentages of silicon bonded organic groups and mole percentages of M-units, D-units, T-units, and Q-units. The multialkenyl polysiloxane was transferred to a 20 mL glass vial having an inside diameter of 25 millimeters (mm) and an outside diameter of 27 mm. The multialkenyl polysiloxane was inspected visually for clarity and color by viewing at an angle perpendicular to the side wall of the vial. Observations regarding clarity were categorized as: solids, indicating a separate phase; hazy, indicating a solution that was not completely clear; slightly hazy, indicating a solution that was almost completely clear; and clear (no solids and no haziness). The refractive index of each multialkenyl polysiloxane was measured using an Abbe Mark II refractometer. Clarity and color observations for the multialkenyl polysiloxane are recorded in Table 4. Table 4 further includes analytical determination of: vinyl content, residual toluene level, glass transition temperature, refractive index, viscosity, and molecular weight.

TABLE 1

Component A-F amounts used to prepare the multialkenyl polyxiloxanes of Examples 1-16.

| Ex. # | Component A | Component B | Component C | Component D | Component E | Component F | Water (g) | Catalyst TBAH 40 wt % in water (g) |
|---|---|---|---|---|---|---|---|---|
| 1 | VPMMOS (1.58 g, 8.88 mmol) | TPSiOH (1.42 g, 5.14 mmol) | DPDMOS (9.06 g, 37.1 mmol) | PTMOS (1.76 g, 8.88 mmol) | DMO(4POP)PS (6.28 g, 18.66 mmol) | | 3.78 | 0.545 |
| 2 | VPMMOS (1.85 g, 10.39 mmol) | TPSiOH (1.79 g, 6.48 mmol) | DPDMOS (10.25 g, 41.99 mmol) | PTMOS (1.28 g, 6.46 mmol) | DMO(4POP)PS (1.57 g, 4.67 mmol) | | 3.78 | 0.545 |
| 3 | VPMMOS (1.85 g, 10.39 mmol) | TPSiOH (0.89 g, 3.22 mmol) | DPDMOS (7.78 g, 31.87 mmol) | PTMOS (0.64 g, 3.23 mmol) | DMO(4POP)PS (7.15 g, 21.25 mmol) | | 3.78 | 0.545 |
| 4 | VPMMOS (1.85 g, 10.39 mmol) | TPSiOH (0.89 g, 3.22 mmol) | DPDMOS (10.38 g, 42.53 mmol) | PTMOS (0.64 g, 3.23 mmol) | DMO(4POP)PS (3.58 g, 10.64 mmol) | | 3.78 | 0.545 |
| 5 | VPMMOS (1.85 g, 10.39 mmol) | TPSiOH (0.89 g, 3.22 mmol) | DPDMOS (11.68 g, 47.85 mmol) | PTMOS (0.64 g, 3.23 mmol) | DMO(4POP)PS (1.79 g, 5.32 mmol) | | 3.78 | 0.545 |
| 6 | VPMMOS (1.85 g, 10.39 mmol) | TPSiOH (2.15 g, 7.79 mmol) | DPDMOS (10.25 g, 41.99 mmol) | PTMOS (1.54 g, 7.77 mmol) | DMO(4POP)PS (0.70 g, 2.08 mmol) | | 3.78 | 0.545 |
| 7 | VPMMOS (1.85 g, 10.39 mmol) | TPSiOH (1.93 g, 6.99 mmol) | DPDMOS (8.49 g, 34.78 mmol) | PTMOS (1.39 g, 7.02 mmol) | TEOS (1.46 g, 7.01 mmol) | DMO(4POP)PS (1.30 g, 3.86 mmol) | 3.78 | 0.545 |
| 8 | VPMMOS (1.85 g, 10.39 mmol) | TPSiOH (1.93 g, 6.99 mmol) | DPDMOS (9.72 g, 39.82 mmol) | PTMOS (1.39 g, 7.02 mmol) | TEOS (0.29 g, 1.39 mmol) | DMO(4POP)PS (1.49 g, 4.43 mmol) | 3.78 | 0.545 |
| 9[a] | VPMMOS (9.97 g, 56 mmol) | DPDMOS (54.4 g, 223 mmol) | DMO(4POP)PS (50.1 g, 149 mmol) | | | | 21.2 | 3.11 |

TABLE 1-continued

Component A-F amounts used to prepare the multialkenyl polyxiloxanes of Examples 1-16.

| Ex. # | Component A | Component B | Component C | Component D | Component E | Component F | Water (g) | Catalyst TBAH 40 wt % in water (g) |
|---|---|---|---|---|---|---|---|---|
| 10 | TMDVDS (1.86 g, 10 mmol) | DPDMOS (15.64 g, 64 mmol) | DMO(4POP)PS (5.38 g, 16 mmol) | | | | 3.72 | 1.30 |
| 11 | TMDVDS (1.86 g, 10 mmol) | DPDMOS (13.68 g, 56 mmol) | DMO(4POP)PS (8.07 g, 24 mmol) | | | | 3.72 | 1.30 |
| 12 | TMDVDS (0.93 g, 5 mmol) | DPDMOS (5.86 g, 24 mmol) | DMO(4POP)PS (5.38 g, 16 mmol) | | | | 1.41 | .65 |
| 13 | TMDVDS (1.86 g, 10 mmol) | DPDMOS (9.77 g, 40 mmol) | DMO(4POP)PS (13.45 g, 40 mmol) | | | | 3.72 | 1.30 |
| 14 | TMDVDS (1.58 g, 8.5 mmol) | DPDMOS (6.65 g, 27 mmol) | DMO(4POP)PS (13.72 g, 41 mmol) | | | | 3.16 | 1.10 |
| 15 | TMDVDS (0.93 g, 5 mmol) | DPDMOS (3.03 g, 12 mmol) | DMO(4POP)PS (9.72 g, 29 mmol) | | | | 1.92 | 0.67 |
| 16 | TMDVDS (0.139 g, 0.746 mmmol) | DMO(4POP)PS (2.01 g, 5.97 mmol) | | | | | 0.275 | 0.126 |

VPMMOS ≡ vinylphenylmethylmethoxysilane;
TPSiOH ≡ triphenylsilanol;
DPDOHS ≡ diphenyldisilanol
DPDMOS ≡ diphenyldimethoxysilane;
PTMOS ≡ phenyltrimethoxysilane;
DMO(4POP)PS ≡ dimethoxy-(4-phenoxy-phenyl)-phenyl-silane;
TEOS ≡ tetraethoxysilane;
PMDMOS ≡ phenylmethyldimethoxysilane;
TMDVDS ≡ tetramethyldivinyldisiloxane

***Note: Tetramethyldivinyldisiloxane is volatile under these reactions conditions, and we find that consistently half of the reagent is not incorporated in the polymer. To reflect this, we show the approximate amount in the polymer product in the table, but the reactor was actually charged with twice as much of this reagent during the synthesis.
[a]Example 9 was prepared by a somewhat different method, a method which is presented infra.

TABLE 2

Amounts (molar percentages) of silicon bonded organic groups (R-Groups) contained in the mixtures of components A-F used to make the multialkenyl polysiloxanes of Examples 1-16.

| Example No. | Vinyl (mol %)[a] | Pheny (mol %) | Methyl (mol %) | Methoxy (mol %) | Ethoxy (mol %) | OH[b] (mol %) | p-POP[c] (mol %) |
|---|---|---|---|---|---|---|---|
| 1 | 3 | 40 | 3 | 47 | 0 | 2 | 6 |
| 2 | 4 | 45 | 4 | 44 | 0 | 2 | 2 |
| 3 | 4 | 39 | 4 | 45 | 0 | 1 | 8 |
| 4 | 4 | 42 | 4 | 45 | 0 | 1 | 4 |
| 5 | 4 | 44 | 4 | 45 | 0 | 1 | 2 |
| 6 | 4 | 46 | 4 | 44 | 0 | 3 | 1 |
| 7 | 4 | 40 | 4 | 39 | 10 | 2 | 1 |
| 8 | 4 | 44 | 4 | 43 | 2 | 2 | 2 |
| 9 | 3 | 38 | 3 | 47 | 0 | 0 | 9 |
| 10 | 7 | 36 | 13 | 40 | 0 | 0 | 4 |
| 11 | 7 | 34 | 13 | 40 | 0 | 0 | 6 |
| 12 | 7 | 32 | 13 | 40 | 0 | 0 | 8 |
| 13 | 7 | 30 | 13 | 40 | 0 | 0 | 10 |
| 14 | 7 | 28 | 13 | 40 | 0 | 0 | 12 |
| 15 | 7 | 26 | 13 | 40 | 0 | 0 | 14 |
| 16 | 4 | 22 | 7 | 45 | 0 | 0 | 22 |

[a]All mole percentage values are rounded to the nearest whole number.
[b]Hydroxy groups are included as "silicon bonded organic groups" herein.
[c]p-POP ≡ p-phenoxyphenyl

TABLE 3

Average composition of multialkenyl polysiloxanes prepared in Examples 1-16 calculated using the assumption that all alkoxy and hydroxy groups react to form Si—O—Si bonds during formation: silicon bonded organic groups (R-Group molar percentages) and primary siloxane units (M, D, T, and Q).

| Example No. | Silicon bonded organic group (mol %) | | | | Primary siloxane unit type[a] (mol %) | | | | |
|---|---|---|---|---|---|---|---|---|---|
| | Vinyl | Phenyl | Methyl | POP | M | D | T | Q | T + Q |
| 1 | 5 | 78 | 5 | 11 | 18 | 71 | 11 | 0 | 11 |
| 2 | 7 | 83 | 7 | 3 | 24 | 67 | 9 | 0 | 9 |
| 3 | 7 | 72 | 7 | 14 | 19 | 76 | 5 | 0 | 5 |
| 4 | 7 | 79 | 7 | 7 | 19 | 76 | 5 | 0 | 5 |
| 5 | 7 | 83 | 7 | 4 | 19 | 76 | 5 | 0 | 5 |
| 6 | 7 | 85 | 7 | 1 | 26 | 63 | 11 | 0 | 11 |
| 7 | 8 | 82 | 8 | 3 | 25 | 55 | 10 | 10 | 20 |
| 8 | 7 | 83 | 7 | 3 | 25 | 63 | 10 | 2 | 12 |
| 9 | 6 | 71 | 6 | 16 | 13 | 87 | 0 | 0 | 0 |
| 10 | 11 | 60 | 22 | 7 | 20 | 80 | 0 | 0 | 0 |
| 11 | 11 | 57 | 22 | 10 | 20 | 80 | 0 | 0 | 0 |
| 12 | 11 | 53 | 22 | 13 | 20 | 80 | 0 | 0 | 0 |
| 13 | 11 | 50 | 22 | 17 | 20 | 80 | 0 | 0 | 0 |
| 14 | 11 | 47 | 22 | 20 | 20 | 80 | 0 | 0 | 0 |
| 15 | 11 | 43 | 22 | 24 | 20 | 80 | 0 | 0 | 0 |
| 16 | 7 | 40 | 13 | 40 | 11 | 89 | 0 | 0 | 0 |

[a]M-, D-, T-, and Q-units are primary siloxane units having a silicon atom bound, respectively, to 1, 2, 3, and 4 —Si—O— moieties.

TABLE 4

Properties of multialkenyl polysiloxanes (Examples 1-16): visual inspection; and analytically determined vinyl content, residual toluene level, Tg, refractive index, and molecular weight.

| Example No. | Clarity[a] | Color | Vinyl (g/mol) | Residual toluene (weight %) | Tg[b] (°C.) | RI[c] | viscosity[d] (cps) | Molecular weight values for multialkenyl polysiloxanes[e] | | |
|---|---|---|---|---|---|---|---|---|---|---|
| | | | | | | | | $M_w$ | $M_n$ | $M_w/M_n$ |
| 1 | clear | none | 1228 | | | 1.612 | | 1200 | 1000 | 1.2 |
| 2 | clear | none | 1321 | 0.11 | | 1.608 | 1,596,200 | 1000 | 900 | 1.1 |
| 3 | clear | none | 1281 | | | 1.612 | | 1200 | 1000 | 1.2 |
| 4 | clear | none | 1315 | 0.17 | | 1.607 | 1,966,700 | 1100 | 900 | 1.2 |
| 5 | clear | none | 1324 | | | 1.605 | | 1000 | 900 | 1.1 |
| 6 | clear | none | 1289 | | | 1.605 | | 1000 | 900 | 1.1 |
| 7 | clear | none | 1176 | | | 1.602 | | | | |
| 8 | clear | none | 1320 | | | 1.605 | | | | |
| 9 | clear | none | 1151 | 0.17 | | | 7,464,000 | 1200 | 1000 | 1.2 |
| 10 | hazy | none | 1236 | 0.08 | 55.67; −2.21 | 1.5993 | 507,430 | | | |
| 11 | slightly hazy | none | 1268 | 0.09 | −0.01 | 1.6016 | 768,510 | | | |
| 12 | clear | none | 1285 | 0.58 | −1.1 | 1.6017 | 430,870 | | | |
| 13 | clear | none | 1253 | 0.53 | −1.85 | 1.6004 | 316,900 | | | |
| 14 | clear | none | 1286 | 0.23 | 4.24 | 1.6054 | 1,756,100 | | | |
| 15 | clear | none | 1320 | 0.14 | 4.3 | 1.6037 | 1,067,600 | | | |
| 16 | clear[f] | ylw[f] | 4252 | 2.60 | | 1.615 | | | | |

[a]All samples were fluids;
[b]Tg = glass transition temperature as determined by Differential Scanning Calorimetry (DSC).
[c]RI = refractive index; d) viscosity in centipoise measured at room temperature
[e]All values for the polydispersity of the molecular weight distribution are rounded to the nearest single decimal place.
[f]Example 16 was made with slightly impure DMO(4POP)PS and had a slight yellow color. The vinyl groups were less than expected due to losses in the synthesis. This polymer has a higher RI due to the lower vinyl content.

ized water (66.0 g), and 24.0 g of 98% sulfuric acid were then added to the reaction vessel. The reaction mixture was stirred at 80° C. for 3.2 hours. The reaction mixture was then diluted with 600 mL of toluene, and extracted once with an equal volume of deionized water, once with an equal volume of a saturated aqueous solution of NaHCO$_3$, and then once more with an equal volume of deionized water. The toluene phase was dried over anhydrous MgSO$_4$, and condensed by rotary evaporation under reduced pressure to yield the multihydrido silicon compound. Yield was 219.4 g of a clear liquid. The hydride content was determined by $^1$H NMR of Si—H versus a toluene internal standard, and found to be 215 g/mol. The molar percentages for the silicon-bonded organic groups of the multihydrido silicon compound are: phenyl (20.02), methyl (29.98), H (29.98), and methoxy (20.02).

Example 9

Synthesis of (p-Phenoxyphenyl)Phenylsiloxane-Co-Diphenylsiloxane with Phenylmethylvinylsilyl Capping Groups A 250 mL 3-neck round-bottom flask was equipped with a thermometer, magnetic stirbar, and short-path distillation head. (p-Phenoxyphenyl)phenyldimethoxysilane (50 grams), 54.51 grams of diphenyldimethoxysilane, and 9.99 g of phenylmethylvinylmethoxysilane were combined with 21.24 g

Example 17

Preparation of Component I Multihydrido Silicon Compound: Ring Opening of Pentamethylcyclopentasiloxane and Condensation with Diphenyl Dimethoxy Silane Diphenyldimethoxysilane (239.1 g, 0.979 mol) and pentamethylcyclopentasiloxane 88.07 g, 0.293 mol) were combined in a 1-liter round bottom flask reaction vessel. Deionized water and 3.11 g of 40% aqueous tetrabutylammonium hydroxide. The flask was jacketed with fiberglass tape, and heated at 80-90° C. for 5.5 hrs. As the reaction progressed, 21.93 grams of methanol were collected via the short-path distillation head. The reaction was diluted with ~250 mL of toluene, and washed 3× with 300 mL volumes of 5% (v/v) HCl in water. This was followed by a 2× wash with 300 mL volumes of DI water. The organic phase was dried with MgSO$_4$. Rotovaping under house vacuum for 60 minutes with a bath temperature up to 90° C. produced a clear viscous polymer (~90% yield).

Example 18

Preparation of Component J Diluent

The diluent, Component J, was prepared by mixing vinylphenylmethylsilane and the Example 17 multihydrido silicon compound so that the ratio of Si—H bonds to Si-vinyl bonds was 2:1. In a 20 mL flask, vinylphenylmethylsilane (10.00 g, 67.4 mmol) and 2.94 g of the Example 17 multihydrido silicon compound were mixed using a magnetic stirrer. The contents were stirrer for approximately 20 minutes to prepare the diluent, Component J of Table 5.

Example 19-32

Preparation and Curing of Curable Phenoxyphenyl Polysiloxane Compositions

The following general procedure was carried out using components G-J in the amounts listed in Table 5. The hydrosilation catalyst solution, Component H, was prepared by dilution with xylenes of a solution of Oskko catalyst (20850 ppm) in xylenes. The ratio of the original Oskko catalyst solution to the added xylenes was 1:1000 (weight/weight). The multialkenyl polysiloxane (Component G) was charged to a 3 mL microbeaker. A magnetic stirring bar and hydrosilation catalyst solution (Component H) were added to the microbeaker, and the contents were stirrer at 85° C. for 1 minute. The contents were cooled to room temperature, and then the multihydrido silicon compound (Component I prepared in Example 23) was charged to the microbeaker. Optionally, diluent (Component J) was also charged to the microbeaker. The curable polysiloxane composition thus formed was then stirred at 85° C. for 1 minute, followed by curing for up to 4 hours.

Example 33

Synthesis of (p-Phenoxyphenyl)Phenyldimethoxysilane 1.29 Grams of magnesium powder were placed in a dry nitrogen purged flask. 100 mL of tetrahydrofuran (anhydrous) was added via syringe, followed by 12 g of p-bromodiphenylether. The mixture was sonicated to begin Grignard formation. The solution was stirred at room temperature for 1 hr, followed by 1 hr at reflux. The solution was cooled. In a separate flask, 10.03 g of methanol-free phenyltrimethoxysilane was added to 60 mL anhydrous THF. The Grignard reagent was slowly added via addition funnel, and the reaction mixture was heated at 70° C. for 16 hours. The reaction was worked up in toluene. The yield was 15.62 grams of liquid (p-phenoxyphenyl)phenyldimethoxysilane.

Example 34

Synthesis of Vinyl Terminated Poly(p-Phenoxyphenyl)Phenylsiloxane 0.91 Grams of (p-phenoxyphenyl)phenyldimethoxysilane was combined with 55.9 mg of divinyltetramethyldisiloxane, 180 mg of water, 423 mg of THF, and 58.5 mg of 40% tetrabutylammonium hydroxide (TBAH). The reaction was refluxed for 135 minutes at 85° C. in an oil bath, followed by 3 hours at 105° C. The reaction was then left at 105° C. for 30 minutes but without a condenser to remove volatiles and water. Reaction was worked up with toluene. Aqueous HCl and water washes were done to remove the TBAH. The yield was 0.47 grams of a liquid polymer, as well as a solid which did not dissolve in toluene. The RI of the polymer was 1.606 as determined by Abbe refractometer.

Example 35

Synthesis of Vinyl Terminated Poly(p-Phenoxyphenylphenylsiloxane-Co-Phenylmethylsiloxane p-Phenoxyphenylphenyldimethoxysilane (970 milligrams) was combined with 130 mg of phenylmeth-

TABLE 5

Components of curable polysiloxane compositions and set times for curing.

| Example number | Component G Multialkylene polysiloxane Source, Example no. | Component G Weight (g) | Component H Oskko catalyst in xylenes (μL) | Component I Multihydrido silicon compound, Example 17 (g) | Component J Diluent, Example 18 (g) | Set time[a] (min.) |
|---|---|---|---|---|---|---|
| 19 | 1 | 1.3106 | 28.1 | 0.4653 | 0.2422 | 50 |
| 20 | 2 | 0.5119 | 9.3 | 0.1529 | 0 | 150 |
| 21 | 3 | 2.2775 | 42.6 | 0.7752 | 0 | 50 |
| 22 | 3 | 2.0898 | 44.4 | 0.7113 | 0.3820 | 75 |
| 23 | 4 | 1.3875 | 25.8 | 0.4600 | 0 | 75 |
| 24 | 4 | 0.4602 | 9.7 | 0.1526 | 0.0836 | 30 |
| 25 | 5 | 1.3018 | 23.2 | 0.3640 | 0 | 60 |
| 26 | 5 | 0.4023 | 8.2 | 0.1125 | 0.0702 | 45 |
| 27 | 6 | 0.5213 | 9.4 | 0.1555 | 0 | Not set |
| 28 | 6 | 0.5255 | 10.8 | 0.1567 | 0.0930 | 75 |
| 29 | 7 | 0.5540 | 10.0 | 0.1610 | 0 | Not set |
| 30 | 7 | 2.154 | 46.8 | 0.7986 | 0.4026 | 75 |
| 31 | 8 | 0.5252 | 9.5 | 0.1527 | 0 | Not set |
| 32 | 8 | 2.2788 | 48.0 | 0.7527 | 0.4134 | 75 |

[a]Typical total cure time is 6 hours at 160° C. Set time is the time it takes for the curing sample to initially gel.

yldimethoxysilane, 74.6 mg of divinyltetramethyldisiloxane, 169 mg of water, 550 mg of THF, and 77.8 mg of 40% tetrabutylammonium hydroxide (TBAH). The reaction was refluxed for 45 minutes at 85° C. in an oil bath, followed by 30 minutes at 95° C., followed by 2.5 hours at 105° C. The reaction was then left at 105° C. for 20 minutes and then 110° C. for 10 minutes but without a condensor to remove volatiles and water. All reaction temperatures are the temperature of the oil bath setting. The reaction was worked up with toluene. Aqueous HCl and water washes were done to remove the TBAH. The yield was 0.82 grams of a liquid polymer. The RI of the polymer was 1.595 as determined by Abbe refractometer.

Examples 36-42

Curable Compositions Demonstrating Light Stability and Control of Viscosity

Specimens containing diluent for viscosity curves and laser aging were prepared as follows. The vinyl-containing polymer Ex. 9 was weighed out in a container, and an appropriate amount of Pt catalyst (Ossko) was added to make the sample 0.25 ppm after all other components are mixed. The Pt complex and vinyl polymer were mixed briefly at 60-80 C. The multihydrido compound Ex 17 and the inhibitor 3,5-dimethyl-1-hexyn-3-ol was then added and mixed in at 60-80 C. Finally, varying amounts of diluent were added and mixed in at 60-80 C to make the final formulation. Mixing was judged complete when the material looked homogenous, and showed no striations or variations in light transmission. Mixing was performed by a mechanical roller or by a stirbar. The amounts and resulting viscosities are shown in the table below. These examples demonstrate that the viscosity of the resulting formulation can be controlled. Three specimens, samples 36, 39, and 42, containing respectively 10, 15, and 20% diluent, were subjected to laser heat aging in the above manner. No change in the appearance of any of the three was observed.

TABLE 6

Viscosity and laser aging results for curable phenoxyphenyl polysiloxane compositions containing diluents.

| Sample Number | Amount (g) Vinyl polymer Ex 9 | Amount (g) Hydrido polymer Ex 17 | Amount (g) phenylmethyl-vinylsilane | Amount (□L) 3,5-dimethyl-1-hexyn-3-ol | Pt concentration (ppm) | Viscosity at 25 C. (centipoise) |
|---|---|---|---|---|---|---|
| 36 | 4.5 | 1.56 | 0.258 | 0.184 | 0.25 | Laser aging[a] |
| 37 | 4.5 | 1.64 | 0.316 | 0.188 | 0.25 | 3754 |
| 38 | 4.5 | 1.76 | 0.394 | 0.193 | 0.25 | 2429 |
| 39 | 4.5 | 1.78 | 0.409 | 0.195 | 0.25 | Laser Aging |
| 40 | 4.5 | 1.87 | 0.475 | 0.199 | 0.25 | 1727 |
| 41 | 4.5 | 2.00 | 0.562 | 0.206 | 0.25 | 1253 |
| 42 | 4.5 | 2.03 | 0.580 | 0.207 | 0.25 | Laser Aging |

[a]For the laser aged samples, a 0.5 gram amount of the mixed composition was placed on 1" square quarts glass slides, to make a sample approximately 0.6 mm thick for laser aging. The samples were cured at 160 C for 6 hours before aging began.

We claim:

1. A curable phenoxyphenyl polysiloxane composition comprising:
   A. a branched multialkenyl phenoxyphenyl polysiloxane represented by average compositional formula II, $(R^6{}_3SiO_{1/2})_c(R^7{}_2SiO_{2/2})_d(R^8SiO_{3/2})_e(SiO_{4/2})_f$ (II), wherein:
   $R^6{}_3SiO_{1/2}$, $R^7{}_2SiO_{2/2}$, $R^8SiO_{3/2}$, and $SiO_{4/2}$ are, respectively, an M-unit, a D-unit, a T-unit, and a Q-unit, all of which are primary siloxane units;

each of $R^6$, each of $R^7$, and each of $R^8$ is, independently, a silicon bonded organic group selected from alkenyl, phenoxyphenyl, aryl other than phenoxyphenyl, alkyl, hydroxy, alkoxy, aryloxy, other organic radical, hydrogen, and combinations thereof;
   at least two silicon bonded organic groups are alkenyl;
     the alkenyl group is CH2=CH-Xs- wherein s=0 or 1, and X is independently selected from: linear, branched or cyclic saturated $C_1$-$C_{16}$ hydrocarbon radical, o-phenyl, m-phenyl, p-phenyl, and combinations thereof;
   the alkenyl group is present in an amount of 1 mole percent to no more than 20 mole percent, based on total moles of the silicon bonded organic group of the multialkylene phenoxyphenyl polysiloxane;
   at least one silicon bonded organic group is a phenoxyphenyl group selected from o-phenoxyphenyl, m-phenoxyphenyl, p-phenoxyphenyl, and combinations thereof;
   the silicon bonded phenoxyphenyl group is present in an amount of greater than 0 mole percent and no more than 99 mole percent, based on the total moles of silicon bonded organic groups in the alkenyl phenoxyphenyl polysiloxane;
   subscripts c, d, e, and f are selected to conform with the mole fractions of $R^6{}_3SiO_{1/2}$, $R^7{}_2SiO_{2/2}$, $R^8SiO_{3/2}$, and $SiO_{4/2}$, respectively;
   0.001≤c≤1; 0≤d≤0.999; 0≤e≤0.20; 0≤f≤0.10; c+d+e+f=1; and e+f>0;
   and
   the multialkenyl phenoxyphenyl polysiloxane has:
     i) a number average molecular weight of at least 500 grams/mole and no more than 5,000 grams/mole; and
     ii) a viscosity of at least 10 and no more than 7,000,000 centipoise at 25° C.;
   B. a multihydrido silicon compound having at least two silicon bonded hydrogen atoms;
   C. a hydrosilation catalyst in an amount effective to catalyze hydrosilation; and
   D. a reactive diluent.

2. The curable phenoxyphenyl polysiloxane composition of claim 1, having a refractive index of at least 1.59 and no more than 1.64.

3. The curable phenoxyphenyl polysiloxane composition of claim 1,
   wherein:
   when 0.00≤e≤0.03, 0.00≤f≤0.03, and 0.00≤e+f≤0.03,
   the silicon bonded phenoxyphenyl group is present in an amount of at least 15 mole percent and no more than 99 mole percent, based on total moles of the silicon bonded organic groups of the multialkenyl phenoxyphenyl polysiloxane;

when 0.00≤e≤0.07, 0.00≤f<0.07, and 0.03<e+f<0.07,
the silicon bonded phenoxyphenyl group is present in an amount of at least 5 mole percent and no more than 99 mole percent, based on total moles of the silicon bonded organic groups of the multialkenyl phenoxyphenyl polysiloxane; and when 0.00≤e≤0.20, 0.00≤f≤10, and 0.07≤e+f≤0.20,
the silicon bonded phenoxyphenyl group is present in an amount of greater than 0 mole percent and no more than 99 mole percent, based on total moles of the silicon bonded organic groups of the multialkenyl phenoxyphenyl polysiloxane.

4. The curable phenoxyphenyl polysiloxane composition of claim 1, wherein the multihydrido silicon compound is selected from:
i) a multihydrido silicon compound having the average compositional formula III,

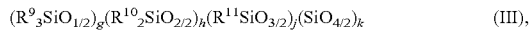

wherein:
$R^9_3SiO_{1/2}$, $R^{10}_2SiO_{2/2}$, $R^{11}O_{3/2}$, and $SiO_{4/2}$ are, respectively, an M-unit, a D-unit, a T-unit, and a Q-unit, all of which are primary siloxane units;
subscripts g, h, j, and k are selected to conform with the mole fraction of $R^9_3SiO_{1/2}$, $R^{10}_2SiO_{2/2}$, $R^{11}SiO_{3/2}$, and $SiO_{4/2}$, respectively;
0≤g≤1; 0≤h≤1; 0≤j≤0.50; 0≤f≤0.10; and g+h+j+k=1;
at least two silicon bonded hydrogen atoms are present in the multihydrido silicon compound;
a silicon bonded hydrogen atom is present in the hydrido silicon compound in an amount of at least 1 mole percent and no more than 60 mole percent, based on total moles of the silicon bonded organic groups of the multihydrido silicon compound; and
each of $R^9$, each of $R^{10}$, and each of $R^{11}$ is, independently, a silicon bonded organic group selected from hydrogen atom, aryl other than phenoxyphenyl, alkyl, hydroxy, alkoxy, aryloxy, phenoxyphenyl, other organic radical, alkenyl, and combinations thereof; and
ii) a hydrido silicon compound having the formula IV:

$$R^{12}_m SiH_{(4-m)} \quad (IV)$$

wherein:
m=1 or 2; and
each $R^{12}$ is, independently, a silicon bonded organic group selected from aryl other than phenoxyphenyl, alkyl, hydroxy, alkoxy, aryloxy, phenoxyphenyl, other organic radical, alkenyl, and combinations thereof;
and combinations thereof.

5. The curable phenoxyphenyl polysiloxane composition of claim 1, wherein:
the reactive diluent is present in the curable phenoxyphenyl polysiloxane composition in an amount of greater than 0 weight percent and no more than 30 weight percent, based on the weight of the curable phenoxyphenyl polysiloxane composition; and
the diluent has a viscosity of at least 1 centipoise and no more than 10,000 centipoise at 25° C.

6. The curable phenoxyphenyl polysiloxane composition of claim 1, wherein the hydrosilation catalyst is present in an amount, expressed as a Group VIII element equivalent value, of at least 0.005 ppm and no more than 3.0 ppm, based on the weight of the curable phenoxyphenyl polysiloxane composition.

7. A method of making a cured phenoxyphenyl polysiloxane composition, comprising the steps of:
A. providing a branched multialkenyl phenoxyphenyl polysiloxane represented by average compositional formula II,

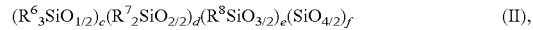

wherein:
$R^6_3SiO_{1/2}$, $R^7_2SiO_{2/2}$, $R^8SiO_{3/2}$, and $SiO_{4/2}$ are, respectively, an M-unit, a D-unit, a T-unit, and a Q-unit, all of which are primary siloxane units;
each of $R^6$, each of $R^7$, and each of $R^8$ is, independently, a silicon bonded organic group selected from alkenyl, phenoxyphenyl, aryl other than phenoxyphenyl, alkyl, hydroxy, alkoxy, aryloxy, other organic radical, hydrogen, and combinations thereof;
at least two silicon bonded organic groups are alkenyl;
the alkenyl group is CH2=CH-Xs- wherein s=0 or 1, and X is selected from: linear, branched, or cyclic $C_1$-$C_{16}$ alkyl, o-phenyl, m-phenyl, p-phenyl, and combinations thereof;
the alkenyl group is present in an amount of 1 mole percent to no more than 20 mole percent, based on total moles of the silicon bonded organic group of the multialkylene phenoxyphenyl polysiloxane;
at least one silicon bonded organic group is a phenoxyphenyl group selected from o-phenoxyphenyl, m-phenoxyphenyl, p-phenoxyphenyl, and combinations thereof;
the silicon bonded phenoxyphenyl group is present in an amount of greater than 0 mole percent and no more than 99 mole percent, based on the total moles of silicon bonded organic groups in the alkenyl phenoxyphenyl polysiloxane;
subscripts c, d, e, and f are selected to conform with the mole fractions of $R^6_3SiO_{1/2}$, $R^7_2SiO_{2/2}$, $R^8SiO_{3/2}$, and $SiO_{4/2}$, respectively;
0.001≤c≤1; 0≤d≤0.999; 0≤e≤0.20; 0≤f≤0.10; and c+d+e+f=1; and
the multialkenyl phenoxyphenyl polysiloxane has:
i) a number average molecular weight of at least 500 grams/mole and no more than 5,000 grams/mole; and
ii) a viscosity of at least 10 and no more than 7,000,000 centipoise at 25° C.;
B. providing a multihydrido silicon compound having at least two silicon bonded hydrogen atoms;
C. providing a hydrosilation catalyst in an amount effective to catalyze hydrosilation;
D. providing a reactive diluent wherein:
the reactive diluent is present in the curable phenoxyphenyl polysiloxane composition in an amount of greater than 0 weight percent and no more than 30 weight percent, based on the weight of the curable phenoxyphenyl polysiloxane composition; and
the diluent has a viscosity of at least 1 centipoise and no more than 10,000 centipoise at 25° C.;
E. optionally, providing a hydrosilation inhibitor in an amount in an amount sufficient to inhibit hydrosilation under conditions of shipment and storage of the curable phenoxyphenyl polysiloxane composition;
F. combining the multialkenyl phenoxyphenyl polysiloxane, the multihydrido silicon compound, the hydrosilation catalyst, the optional diluent, and the optional hydrosilation inhibitor to form a curable phenoxyphenyl polysiloxane composition; and G. curing the curable phenoxyphenyl polysiloxane composition.

8. The method of claim 7, further comprising the steps of:
C. providing a semiconductor device comprising semiconductor elements; and
D. forming a coating on at least one surface of at least one of the semiconductor elements by a technique comprising steps selected from:
   applying the curable phenoxyphenyl silicon composition to the surface before or during the step (B) of curing;
   applying the cured phenoxyphenyl polysiloxane composition to the surface; and
   combinations thereof.

9. The curable phenoxyphenyl polysiloxane composition of claim 5, further comprising an inert diluent, wherein:
the inert diluent is present in the curable phenoxyphenyl polysiloxane composition in an amount of greater than 0 weight percent and no more than 40 weight percent, based on the weight of the curable phenoxyphenyl polysiloxane composition;
the combination of the reactive diluent and the inert diluent is present in the curable phenoxyphenyl polysiloxane composition in an amount of greater than 0 weight percent and no more than 40 weight percent, based on the weight of the curable phenoxyphenyl polysiloxane composition.

10. The method of claim 7, further comprising providing an inert diluent, wherein:
the inert diluent is present in the curable phenoxyphenyl polysiloxane composition in an amount of equal to or greater than 0 weight percent and no more than 40 weight percent, based on the weight of the curable phenoxyphenyl polysiloxane composition; and
the combination of the reactive diluent and the inert diluent the inert diluent is present in the curable phenoxyphenyl polysiloxane composition in an amount of greater than 0 weight percent and no more than 40 weight percent, based on the weight of the curable phenoxyphenyl polysiloxane composition.

* * * * *